United States Patent
Smith, III et al.

(10) Patent No.: US 11,172,585 B1
(45) Date of Patent: Nov. 9, 2021

(54) MAGNETIC OPERATOR INTERFACE ASSEMBLY

(71) Applicant: New Frontier Technologies LLC, Overland Park, KS (US)

(72) Inventors: Paschal Early Smith, III, Raymore, MO (US); Chinh Huu Bui, Kansas City, MO (US); Randall Kevin Sambursky, Kearney, MO (US); Donald Craig Walker, Kansas City, MO (US); David W Baarman, Fennville, MI (US)

(73) Assignee: New Frontier Technologies LLC, Overland Park, KS (US)

( * ) Notice: Subject to any disclaimer, the term of this patent is extended or adjusted under 35 U.S.C. 154(b) by 0 days.

(21) Appl. No.: 17/306,381

(22) Filed: May 3, 2021

(51) Int. Cl.
    *H01F 7/02*     (2006.01)
    *H05K 5/03*     (2006.01)

(52) U.S. Cl.
    CPC ............. *H05K 5/03* (2013.01); *H01F 7/0242* (2013.01)

(58) Field of Classification Search
    None
    See application file for complete search history.

(56) References Cited

U.S. PATENT DOCUMENTS

| | | | | |
|---|---|---|---|---|
| 8,040,678 B2* | 10/2011 | Tai | ........................... | H02S 40/34 361/752 |
| 9,232,675 B2* | 1/2016 | Schurr | ................. | H05K 7/1481 |
| 9,888,588 B2* | 2/2018 | Esterbauer | ........ | G02F 1/133308 |
| 9,924,609 B2* | 3/2018 | Dane | ..................... | H05K 7/1458 |
| 10,734,162 B2* | 8/2020 | Sano | ....................... | H01G 4/236 |
| 11,026,529 B2* | 6/2021 | Ferraro | .............. | A47G 19/2261 |
| 2011/0011759 A1* | 1/2011 | Luo | .......................... | A45C 15/06 206/320 |
| 2012/0233819 A1* | 9/2012 | Davis | ..................... | F16L 37/004 24/303 |
| 2012/0319313 A1* | 12/2012 | Davis | ................. | B65D 43/0202 261/119.1 |

(Continued)

OTHER PUBLICATIONS

Smith & Loveless Inc., Shade Aide HMI Protector, downloaded at https://www.smithandloveless.com/products/controls-accessories/shade-aide-hmi-protector, on Apr. 1, 2021.

(Continued)

*Primary Examiner* — Xanthia C Cunningham
(74) *Attorney, Agent, or Firm* — Warner Norcross + Judd LLP

(57) ABSTRACT

A system for connecting and monitoring a magnetic operator interface assembly. The assembly can provide protection of an operator interface by limiting glare, UV damage, and exposure to rain. It can also protect the operator interface from high pressure cleaning equipment. The assembly is removably magnetically mountable to a sealed enclosure without breaching the enclosure's seal. The magnetic operator interface assembly can withstand operational forces, staying at a magnetically fixed position and without becoming accidentally detached. It is also easy to intentionally install and remove. The system may include sensors that can inform a local or remote dashboard about the status of the magnetic operator interface assembly, such as whether it is installed and whether the cover is open or closed. The system may also include a locking system to prevent tampering and limit access to the operator interface.

23 Claims, 16 Drawing Sheets

(56) References Cited

U.S. PATENT DOCUMENTS

| | | | | |
|---|---|---|---|---|
| 2013/0113584 | A1* | 5/2013 | Hunts | H01F 7/0252 |
| | | | | 335/285 |
| 2017/0105297 | A1* | 4/2017 | Han | G06F 1/16 |
| 2017/0354057 | A1* | 12/2017 | Dorenkamp | H05K 5/03 |
| 2019/0173398 | A1* | 6/2019 | Mak | H01L 41/0533 |
| 2019/0326043 | A1* | 10/2019 | Janna | H01F 7/0242 |
| 2019/0372268 | A1* | 12/2019 | Sitbon | H05K 5/0217 |
| 2020/0170431 | A1* | 6/2020 | Shafer | A47G 23/0225 |

OTHER PUBLICATIONS

FIBOX Enclosing Innovations, HMI Cover, downloaded at https://www.fiboxusa.com/general-enclosure-accessories/hmi-cover/, on Apr. 1, 2021.

Allied Moulded Products, Inc., HMI Cover Kits, downloaded at https://www.alliedmoulded.com/product-category/industrial-enclosures-accessories/enclosure-accessories/hmi-cover-kits/, on Apr. 1, 2021.

Vynckier Enclosure Systems, Inc., downloaded at https://www.vynckier.com/product/a61-dtcoverkit/, on Apr. 2, 2021.

\* cited by examiner

MAGNETIC OPERATOR INTERFACE ASSEMBLY

BACKGROUND OF THE INVENTION

The present disclosure relates to a magnetic operator interface assembly for protecting an operator interface, which may be mounted without breaching the panel housing of the operator interface.

Operator interfaces can be subject to a variety of environmental conditions that can negatively impact the interface. Put another way, an interface can encounter certain conditions due to natural and human activity that can lead to malfunction, inefficiency, security risk, general aesthetic degradation, or other issues.

For example, an operator interface installed in a panel located outside may be subject to precipitation and other weather events. Particularly harsh weather, such as violent storms, extreme temperatures, and large temperature fluctuations, can be potentially damaging. However, even more common, milder, weather events, such as rain, snow, daily sunlight, and expected temperatures and humidity levels, can have a significant negative impact, especially after repeated or prolonged exposure. For example, ultraviolet ("UV") rays from sunlight that can damage operator interface aesthetics and functionality. Sunlight can also produce glare on the interface making it more difficult for the operator to see and use effectively and efficiently. Issues with sunlight can also exist for indoor interfaces installed in areas with natural light, and interface glare can also be created by other direct or indirect light sources, such as incandescent lights, fluorescent lights, light emitting diodes, or other light sources.

Operator interfaces may be used in various applications across numerous industries, and each application comes with its own challenges and issues related to integrity of the operator interface. For example, operator interfaces are used in industrial meat-processing facilities to allow an operator to monitor status, interact, or otherwise interface with various machines. Because of the nature of the environment of a meat-processing facility, and other types of industrial and commercial facilities, many of the machines are installed in sealed enclosures for ingress protection from solids and liquids, such as dust and water that could potentially be harmful. This helps to limit environment exposure to the internal content and vice versa, such as during cleaning. For example, it is common to clean meat-processing facilities with a power sprayer or other vigorous cleaning tools. While the enclosure aims to protect the inner workings of the machine, the operator interface is accessible and therefore exposed at the outer surface of the enclosure to the high pressure spray, which can cause damage both through exposure to liquid and the force of the spray itself. The high pressure spray may also activate the operator interface unintentionally.

Known assemblies may protect the operator interface from many of the issues described above. However, installation of these assemblies typically requires breaching the enclosure in order to install the assembly, for example by drilling holes for fasteners. These assemblies therefore require complex seals and tightening procedures to assure proper sealing. Some known assemblies incorporate their connection systems and seals within the operator interface. These breaching assemblies also typically void the warranty of the operator interface and void any certification with regard to the enclosure seal.

Every breach of the panel creates the potential for ingress or egress of unwanted solids or liquids. Accordingly, an undesired leak can form a failure point of the panel and therefore of the overall structure that contains the panel. Further, requiring a breach makes installation and uninstallation more difficult. For example, they likely require special tools to create the breach, ceasing or altering machine operation, and re-sealing the breach in order to resume normal operation.

SUMMARY OF THE INVENTION

The present disclosure provides a magnetic operator interface assembly. Externally accessible operator interfaces can be provided for various enclosures via a panel housing an operator interface. One aspect of the disclosure relates to an assembly for protecting an operator interface from the environment by shielding the interface, selectively covering the interface, or both. Another aspect of the disclosure relates to mounting the assembly magnetically without breaching the panel housing the operator interface or the overall enclosure in which the panel is installed. Yet another aspect of the disclosure relates to mounting systems for mounting the magnetic operator interface assembly to magnetic enclosures and non-magnetic enclosures.

In one embodiment, the assembly includes a plurality of magnets and a shield. The shield can be mounted such that it at least partially surrounds and shields an operator interface. The assembly mounts to a panel housing the operator interface through the magnetic force of the magnets. The shield can include a backing for receiving the magnets that cooperatively form a common magnetic surface and a barrier that extends away from the common magnetic surface of the backing and at least partially around the periphery of the backing.

In another embodiment, the assembly includes a cover. The cover can be movably mounted to the shield, such as via a hinge, slide, or other opening system. The cover can have two main positions: a closed position where the operator interface is inaccessible and an open position where the operator interface is accessible. In one hinged embodiment the closed position is generally parallel to the front surface of the backing, and the open position is generally perpendicular to the front surface of the backing and parallel to a portion of the barrier extending away from the backing. The cover may optionally be held in open and closed positions magnetically. One or more magnets may be joined to the backing, barrier, or both that interact with one or more magnets joined to the cover. Specifically, an open position magnet can be installed along the edge of the inner surface of the barrier, a closed position magnet can be installed along a backing surface, and a cover magnet can be installed opposite the hinged edge oriented for attraction to the open and closed magnets where the cover is in the respective open and closed positions. Alternatively, where the backing and barrier are made of magnetic material, one or more magnets can be installed on the cover that magnetically attract to the backing and barrier in the respective closed and open positions.

The protective assembly may form part of a larger system for monitoring or securing the operator interface.

One aspect of the present disclosure relates to locking the cover of a magnetic operator interface assembly to prevent access to the operator interface. In a cover embodiment of a magnetic operator interface assembly, the magnetic operator interface assembly is configured such that a locking device can be installed, locked, unlocked, and uninstalled while the magnetic operator interface assembly is magnetically mounted to a panel housing the operator interface. In one embodiment, the barrier of the shield defines an opening for receiving a shackle of an unlocked mechanical locking device. The opening is positioned such that once the shackle is inserted through the opening and locked while the cover is in the closed position, the locking device effectively prevents the cover from moving from the closed position to the open position because a portion of the locking device blocks movement of the cover. By unlocking the locking device and removing the shackle the cover can again be moved between the closed and open positions. In another embodiment, a magnetic locking system is provided. The magnetic locking system can use standard or correlated magnets to provide additional security for the operator interface.

Another aspect of the present disclosure relates to a detection system for detecting a variety of characteristics of the magnetic operator interface assembly. The detection system can communicate with the operator interface, a smart mobile device in proximity of the magnetic operator interface assembly, or another computer system. The detection system can include one or more detectors, such as hall effect sensors or other types of detectors, that can detect characteristics about the magnetic operator interface assembly. The detectors can be installed at essentially any combination of the panel housing the operator interface, the magnetic operator interface assembly, and the enclosure in which the panel is housed. The detectors can be positioned such that information from the various magnets can be extracted. For example, information regarding installation status of the assembly as well as the open and closed positions of the cover can be detected based on the magnetic field strength detected.

These and other objects, advantages, and features of the invention will be more fully understood and appreciated by reference to the description of the current embodiment and the drawings.

Before the embodiments of the invention are explained in detail, it is to be understood that the invention is not limited to the details of operation or to the details of construction and the arrangement of the components set forth in the following description or illustrated in the drawings. The invention may be implemented in various other embodiments and of being practiced or being carried out in alternative ways not expressly disclosed herein. Also, it is to be understood that the phraseology and terminology used herein are for the purpose of description and should not be regarded as limiting. The use of "including" and "comprising" and variations thereof is meant to encompass the items listed thereafter and equivalents thereof as well as additional items and equivalents thereof. Further, enumeration may be used in the description of various embodiments. Unless otherwise expressly stated, the use of enumeration should not be construed as limiting the invention to any specific order or number of components. Nor should the use of enumeration be construed as excluding from the scope of the invention any additional steps or components that might be combined with or into the enumerated steps or components. Any reference to claim elements as "at least one of X, Y and Z" is meant to include any one of X, Y or Z individually, and any combination of X, Y and Z, for example, X, Y, Z; X, Y; X, Z; and Y, Z.

DESCRIPTION OF THE CURRENT EMBODIMENTS

Figure 1:
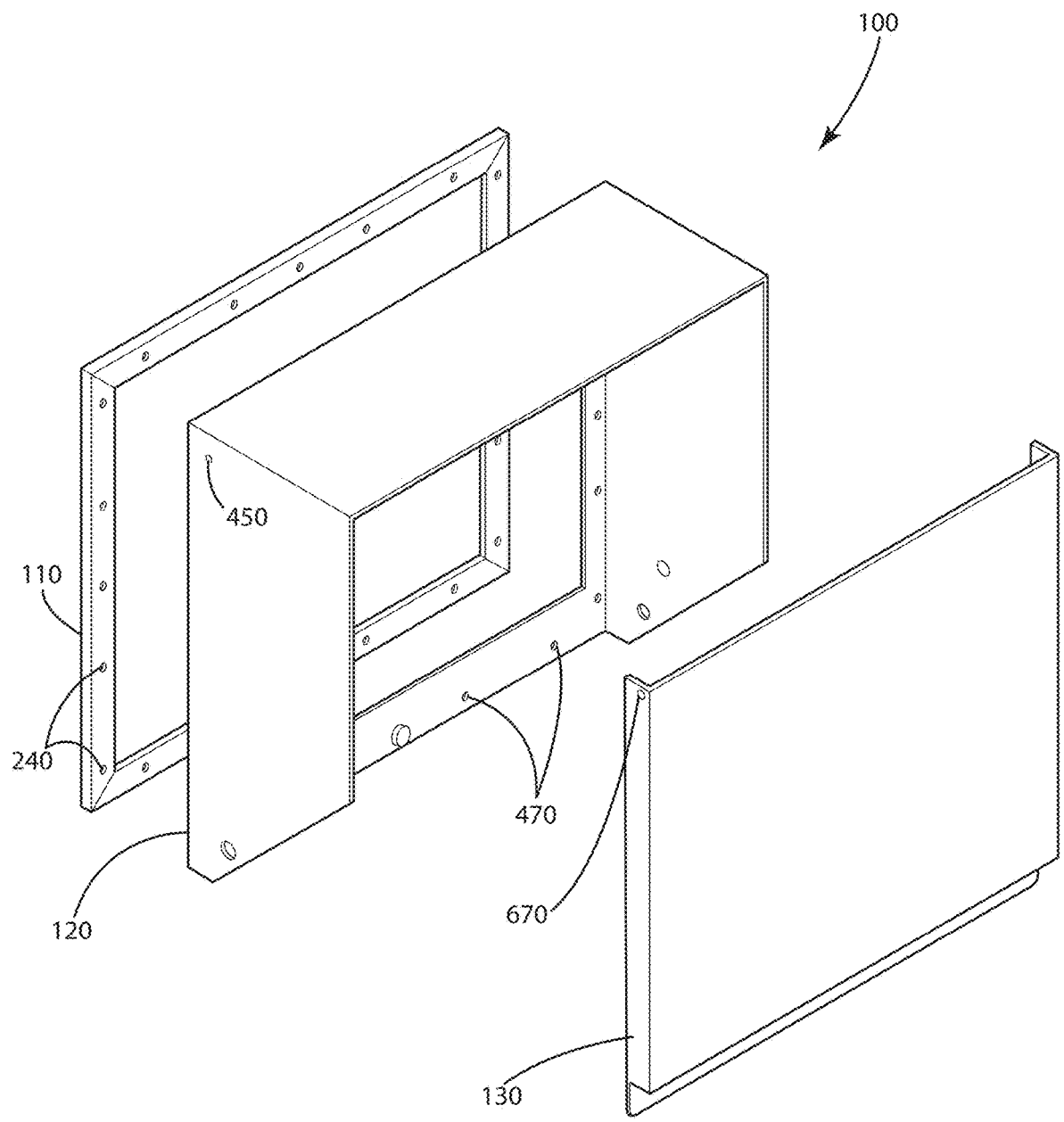
FIG. 1 is an exploded view of a magnetic operator interface assembly according to one embodiment.

A variety of different aspects and embodiments of a protective magnetic operator interface assembly are described herein. The assembly can be installed without breaching any surfaces, making installation unobtrusive and simple. The installed magnetic operator interface assembly partially or fully frames the operator interface to provide a degree of protection from its environment. Systems and methods in connection with manufacturing, operating, installing, and removing the magnetic operator interface assembly according to various aspects and embodiments are also described.

A variety of industries make use of sealed enclosures with some form of an operator interface. For example, food-processing, oil and gas, and manufacturing, to name a few exemplary industries, often house electrical, mechanical, or other equipment in sealed enclosures that are controllable via a control panel, monitorable via a monitoring panel, or can otherwise be interacted with by an operator via another type of operator interface.

The operator interface may include one or more individual interface elements for interacting with associated equipment in a sealed enclosure. The individual interface elements can be mounted directly to the sealed enclosure housing the equipment or collectively mounted to a panel to form a panel mounted operator interface, which can be referred to as a panel interface or panel for short. The panel interface can form a portion of the sealed enclosure housing the equipment or the panel interface may constitute its own sealed enclosure, independent from the sealed enclosure housing the associated equipment. Where an interface panel forms an independent enclosure, it may be disposed on or joined to the sealed enclosure housing the equipment, or be disposed elsewhere, locally or remote, to the sealed enclosure housing the equipment. The independent interface panel may communicate with the equipment housed in its sealed enclosure via wire or electrical connector that breaches the sealed enclosure housing the equipment and the interface panel's independent enclosure. Because the breaching element (e.g., wire or connector) is typically installed permanently and prior to the enclosure rating process, such breach can be accounted for in the manufacturing process to achieve a desired enclosure rating unlike post manufacturing breaches that are unaccounted for in the enclosure rating and may only be utilized for temporarily fastening an article to the enclosure. Further, enclosures subject to post-manufacturing breaches may not be properly and timely rerated.

It is worth noting that the equipment housed in the sealed enclosure (including the interface elements and any associated electronics where the operator interface forms part of the sealed enclosure for the equipment) and the interface elements (and any associated electronics) in the independent panel interface embodiments may be powered via wires or electrical connectors that breach the respective enclosures. For example, via direct or indirect connection to mains power. Again, because the breaching element (e.g., wire or connector) is typically installed permanently during manufacture and prior to the enclosure rating process, such breach can be accounted for in the manufacturing process to achieve a desired enclosure rating. In some applications, non-breaching power sources, such as via battery or wireless power transfer through an enclosure wall, can be utilized instead of or in addition to breaching power sources.

Industrial sealed enclosures can be rated by the National Electrical Manufacturers Association ("NEMA") chart or another enclosure rating system. There are six main NEMA ratings (NEMA 1, NEMA 3, NEMA 3R, NEMA 4, NEMA 4X, and NEMA 12). These different NEMA ratings correspond to the types of environments an enclosure with that rating should be able to withstand. For example, a NEMA 1 rating certifies an enclosure for indoor use to provide a degree of protection against access to hazardous parts and provides a degree of protection of the equipment inside the enclosure against ingress of solid foreign objects, while a NEMA 4X rating certifies an enclosure for indoor or outdoor use to protect against access to hazardous parts, protect the equipment inside the enclosure against ingress of solid foreign objects, such as windblown dust, protects against harmful effects on the equipment due to the ingress of water (e.g., rain, sleet, snow, splashing water, and hose directed water), provides an additional level of protection against corrosion, and will be undamaged by the external formation of ice on the enclosure. While references are made throughout the disclosure to NEMA ratings and enclosure ratings generally, it should be understood that at least certain embodiments and aspects are not dependent on or limited by enclosure ratings, let alone the specific NEMA enclosure rating standard. The NEMA ratings are discussed because they provide context regarding sealed enclosures and the types of protection provided for a particular environment. For example, in some applications, an enclosure can be rated water-tight, and as such, breaching an enclosure to install an aftermarket device can impact not only the rating, but whether or not the enclosure is water-tight, in practice.

It is fairly common industry practice for panel fabricators to modify NEMA rated enclosures by installing operator interfaces, which may themselves be NEMA rated. Because the installation of each interface typically involves drilling holes through an enclosure, the integrity of the enclosure's seal is compromised. The sealing methods, seal types, pressures, torques, and surface materials can all be factors that determine the quality and other characteristics of the seal. Some embodiments of this disclosure create a secondary seal and additional layer of protection to protect the integrity of the enclosure and to limit intrusion and ingress. Some embodiments of the disclosure address these issues with seal sensors and control interlocks, for example magnetic field sensors and magnetic lock and key systems, which will be discussed in more detail below.

The NEMA rating depends on when the rating happens. For example, an enclosure with an after-market operator interface installed can itself be NEMA rated if the evaluation occurs after the operator interface installed. In this scenario, the installation of the operator interface would not qualify as a breach of the enclosure because the enclosure was evaluated and determined to be sealed after the operator interface was installed.

As discussed above, the operator interface can be mounted, integrally formed with, or otherwise housed in a panel that either forms a portion of a sealed enclosure housing associated equipment or forms, in part or in total, an independent sealed enclosure. As such, the exposed portions of the operator interface are generally vulnerable to the environment that the sealed enclosure resides, which may be harsh. For example, the environment may be harsh due to natural environmental conditions such as rain, snow, or sleet, or due to human activity, such as tampering. Therefore, it is desirable to protect the operator interface from the enclosure's environment. However, it is undesirable for such a protective device to breach the sealed enclosure in order to install a protective assembly because such a breach introduces a new vulnerability to the enclosure and may void or degrade the enclosure's NEMA rating.

The operator interface can take a variety of different forms. For example, in one embodiment, the operator interface is a human-machine interface ("HMI") such as a touch screen. Additionally, or alternatively, the operator interface can include a pushbutton, switch, variable speed drive control, switchgear electrical panel, mechanical controls, electrical controls, or other operator interface elements. The operator interface can be referred to as a user control interface, control interface, monitoring interface, or any other type of interface. The operator interface may also be referred to as panel-mounted equipment.

Some operator interfaces are sealed and have their own NEMA rating. For example, an HMI with a corresponding set of electronics may be incorporated into one sealed package with a water-tight seal. However, a second layer of protection is still valuable to protect the operator interface against wear and high pressure washing by reducing exposure to high pressure streams and debris build up.

In FIG. 1, an exploded view of a magnetic operator interface assembly 100 according to one embodiment is shown. The magnetic operator interface assembly 100 may alternatively, or with respect to certain embodiments, be referred to as a protective cover, a shield, and a protective barrier. The magnetic operator interface assembly 100 includes a backing 110, a shield 120, and a cover 130. The backing 110 is joined to the shield 120, and the cover 130 is movably joined to the shield 120. Each of these elements is described more specifically with respect to the figures that follow.

When installed on a metal or other magnetic surface, the magnetic operator interface assembly 100 can form a chamber between the cover and the installation surface. The magnetic operator interface assembly 100 can provide a seal when the cover 130 is in the closed position, in some embodiments it may be a water-tight seal. A gasket may be interposed between the cover 130 and the shield 120 to assist in forming the seal in the closed position. In constructions without a shield or constructions where the shield is not disposed between the cover and the backing, the seal may be formed between the cover 130 and the backing 110 to create the chamber seal and a gasket may be interposed between the cover 130 and the backing 110 to assist in forming the seal in the closed position. The magnetic operator interface assembly 100 can be fabricated from a non-magnetic material (such as stainless steel or aluminum) and still maintain its ability to magnetically mount to a panel.

Figure 2:
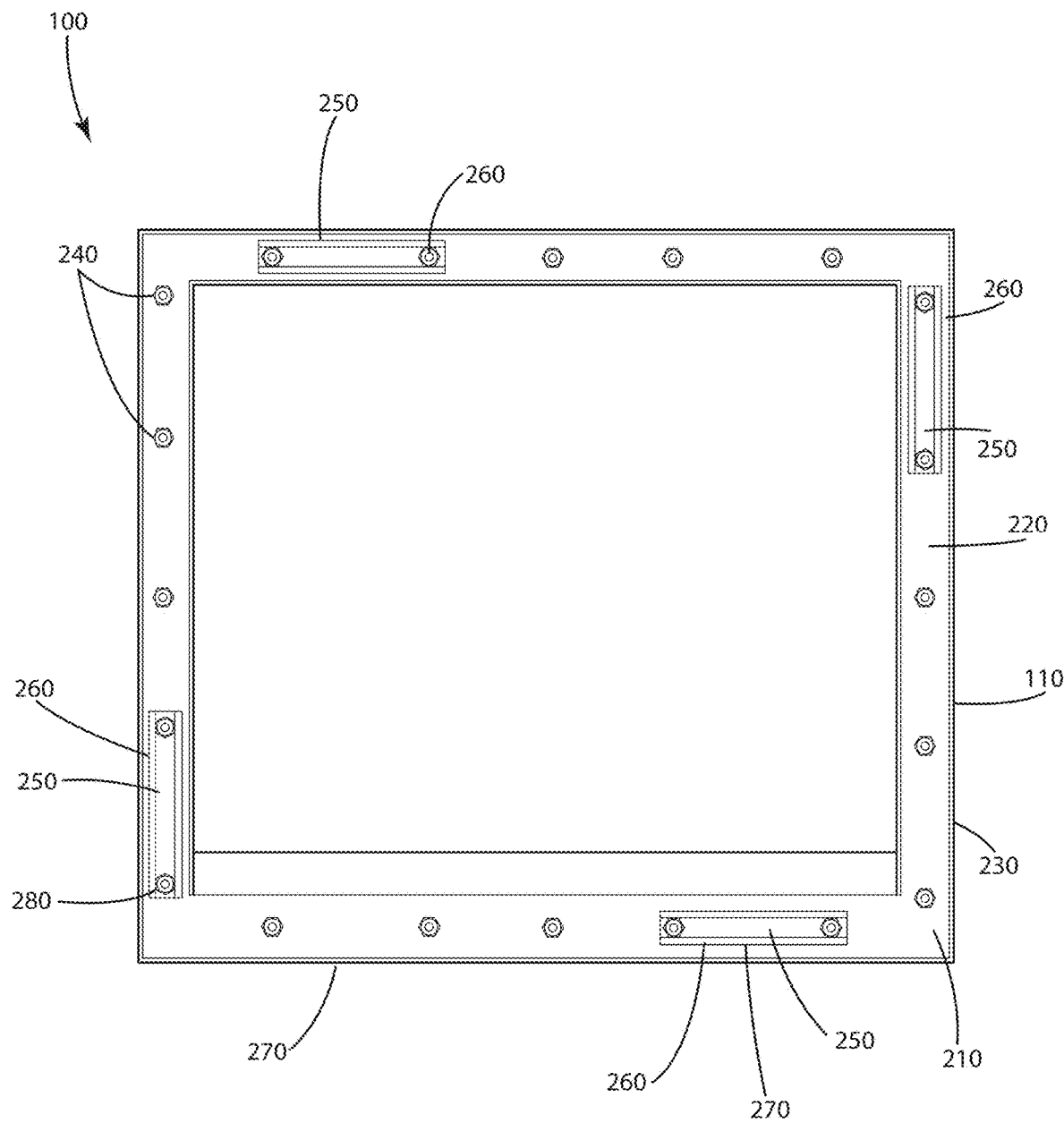
FIG. 2 is a rear view of a magnetic operator interface assembly according to one embodiment.

In FIG. 2, a rear view of the magnetic operator interface assembly 100 according to one embodiment is shown. The backing 110 may also be referred to as a magnet plate, a magnetic plate, and a seal plate. The backing 110 is prominently shown in this figure. The backing 110 is configured to at least partially surround an operator interface. In the depicted embodiment, the backing 110 is sized and shaped to completely surround the planar outline of a large variety of common operator interfaces or the panels in which they sit. The backing 110 has a magnet mount surface 210. The magnet mount surface 210 is surrounded on either side by an inner edge 220 and an outer edge 230. The outer edge 230 extends from the magnet mount surface 210. The magnet mount surface 210 has a plurality of holes 240 that allow the backing 110 to mount to the shield 120, and also allow a plurality of magnets 250 to be mounted to the backing 110. The plurality of magnets 250 may be rare-earth magnets, or any other magnet of suitable strength and size, having one or more magnetic poles. The magnets can be bar magnets, pot magnets, or essentially any other type of magnet. In the depicted embodiment, four of the same general size, shape, and strength rare-earth magnets 250 are used. However, the number, size, and shape of magnets 250 and the method of attaching the magnets 250 to the backing 110 may vary from application to application. Further, in some applications where multiple magnets are included, the magnets can be of different size, shape, and other characteristics.

In pot magnet embodiments, each of the pot magnets can be disposed about the magnet mount surface 210 to generate an isolated individual closed circuit with a different portion of the ferromagnetic surface of the sealed enclosure. Each of the pot magnets can be configured with a first magnetic pole at the center region of the pot magnet and a second, opposite, magnetic pole at the edge of the pot magnet. For example, the north pole may be provided at the center, while the south pole may be configured about the edge of the pot magnet. The pot magnets can be formed by embedding magnets directly into a steel cup or channel formed in the backing. Alternatively, off the shelf pot magnets that include a shell may be embedded or otherwise flush mounted onto the backing such that the magnet face is flush with the depth of the backing channel.

The magnetization, poles, and other characteristics of the magnets can be configured (e.g., selected) to provide individual or combined desired magnetic field strength or other characteristic or set of characteristics. For example, the magnets can be configured to provide a particular magnetic flux density (tesla T Wb/m$^2$), magnetic flux (weber (Wb), volt-second Vs), magnetomotive force (ampere A), magnetic field strength or magnetizing force (A/m$^j$), volume magnetization (A/m), magnetic polarization (A/m), magnetic moment (Joule per tesla (J/T)), particular magnetic dipole moment (Wbm$^j$), permeability (H/m), relative permeability, energy density (J/m$^3$), demagnetization factor, or essentially any other magnetic characteristic. Some of the characteristics may be influenced by not only the material, shape, and number of magnets themselves, but also their relative position on the magnetic operator interface assembly, as well as the materials, shape, and characteristics of the other components of the magnetic operator interface assembly as well as the surface the magnetic operator interface assembly where the assembly is to be mounted.

For example, in some embodiments, the plurality of magnets can be configured to provide magnetic characteristics sufficient to removably magnetically couple the magnetic operator interface assembly to a sealed enclosure and withstand operational forces. Operational forces can include all of the forces that the magnetic operator interface assembly can encounter during operation, such as in a commercial or industrial environment. These can include not only the gravitational force due to the weight of the assembly itself, but also the various forces that the assembly may encounter due to day to day operations, which can vary based on a number of factors such as the assembly's expected use and installation location. While accessing the operator interface assembly does not necessitate physical interaction by the operator with the magnetic operator interface assembly beyond actuation of the cover in cover embodiments, the operator may intentionally or unintentionally physically interact, directly or indirectly, with the assembly during normal operation. For example, a human operator may lean, press, push, knock, bump, nudge, touch or otherwise apply force to the magnetic operator interface assembly. The force may be applied directly by the operator's body, or indirectly via an instrument, such as a power washer or other equipment. Operational forces can also include natural environmental forces, such as those produced by weather events and the natural environment of the assembly. These can include not only rain, snow, sleet, and other weather events, but also environment characteristics such as ambient temperature, humidity, and temperature changes.

The assembly, including the plurality of magnets can be configured to provide magnetic characteristics that not only magnetically mount the assembly to an enclosure such that it can withstand operational forces, but also without preventing intended manipulation of the magnetic operator interface assembly. That is, the set of magnetic characteristics provided by the magnetic operator interface assembly can be selected such that mounting to a standard or predefined sealed enclosure provides a magnetic coupling that is sufficient to overcome operational forces without preventing removal, movement, or other purposeful actions, such as those taken by a trained technician. Such a magnetic coupling can be provided by a plurality of magnets configured (e.g., selected) based on a range of desired operator force to manipulate the backing of the magnetic operator interface assembly relative to the surface of the sealed enclosure to which it is mounted. In some embodiments, withstanding operational forces includes providing magnetic strength sufficient such that the assembly will not become detached or significantly shift in position on the enclosure in response to operational forces. In some embodiments, the purposeful actions can be defined as a set of one or more actions without the use of tools, such as uninstallation or re-positioning by operator applied force. In other embodiments, the purposeful actions can be defined as a set of one or more actions with a specific tool, such as uninstallation of the assembly with a screwdriver or other wedge-tool by application of suitable force at a defined location, such as notch 270. Accordingly, the backing and plurality of magnets can be configured to attach the assembly to a sealed enclosure such that it stays in place during normal operational forces, but not so strong such that the assembly cannot be intentionally repositioned or uninstalled.

In embodiments where the backing and shield are discrete elements, they can be joined together to form a portion of the assembly in essentially any manner. In the current embodiment, the backing 110 includes a set of holes 240 that align with a set of holes 470 in the shield 120 when the edges of the backing and shield are lined up. These holes can be used to join or otherwise couple the backing 110 and the shield 120 with fasteners. Essentially any suitable type and number of fasteners can be utilized to sufficiently secure the backing to the shield. For example, the fasteners may be bolts and nuts or screws and a majority or all of the holes can be used for fastening. The backing 110 and the shield 120 can also be joined without the use of holes or apertures in their surfaces. For example, the backing and shield can be fastened by use of an adhesive interposed between the front surface of the backing 110 and the back surface of the shield 120. Alternatively, the backing 110 and the shield 120 may be manufactured as one contiguous piece, for example by forming the shape from bending sheet metal and associated techniques.

The magnets 250 may be attached to the magnet mount surface 210 through the use of a casing 260 that defines an opening to fit the magnet 250. The casing 260 may also be referred to as a holder. The magnet 250 can sit within the casing 260. In some embodiments, the casing 260 may itself be formed from a magnetic material and constitute part of the magnet 250. The magnet 250 may be attached to the casing 260 through any suitable method. For example, the magnet 250 may be attached to the casing 260 through an adhesive or by being friction fit into the casing 260. In the depicted embodiment, the casing 260 has two holes 280 and the holes 280 are configured to align with the plurality of holes 240 in the backing 110. The casing 260 is thus connected to the interfacing surface through the fastener connecting the backing 110 to the shield 120. In alternative embodiments, the magnets 250 may be friction fit to the backing 110 between the inner edge 220 and the outer edge 230 without the use of a casing. Additionally, or alternatively, the magnets 250 may be attached to the backing 110 through an adhesive. The magnets 250 are attached to the backing 110 such that the visible surface of the magnets 250 is flush with the terminating or outer edge 230 of the backing 110. This allows the magnetic operator interface assembly to be installed flush against a panel creating a watertight seal with the panel such that water cannot easily seep between the backing 110 and the surface to which the assembly is magnetically mounted.

A watertight seal protects an operator interface from rain, and high pressure wash down procedures, which are common in certain industries. A watertight seal may also have a positive long-term effect on reliability of an operator interface and an enclosure. NEMA enclosures in some instances are designed to seal electronics in a watertight environment. For example, the meat processing industry utilizes high pressure sprayers to clean down the production lines and equipment. Breaching an enclosure can create a potential leak and failure point. Accordingly, a magnetic operator interface assembly 100 that can be installed without breaching an enclosure reduces the number of breaches, and can reduce the number of enclosure failures. Hence, the magnetic operator interface assembly of the present disclosure can provide additional protection for an operator interface without introducing additional points of failure.

The particular endurance of the assembly and its ability to withstand various forces can vary depending on the number of magnets, strength of the magnets, and the surface interface. The magnetic operator interface assembly 100 can protect an operator interface located not only on a magnetic enclosure, but also an operator interface located on a non-magnetic enclosure as will be discussed in connection with other embodiments, for non-metallic enclosures.

The backing 110 may also have at least one notch 270. The notch 270 defines an opening in the outer edge 230. The notch 270 provides an extra layer of protection against liquid that seeps between the panel and the magnetic operator interface assembly. If any water becomes trapped between the magnetic operator interface assembly 100 and a panel, the water will flow through the force of gravity down the backing 110 and out the notch 270. The notch 270 also allows moisture trapped between the magnetic operator interface assembly 100 and a panel to escape. The notch can also be dual-use and serve as a leverage point for uninstalling the assembly. While the magnetic operator interface assembly has tool-less installation and removal, the magnetic force coupling the assembly to the panel is typically rather strong so that the assembly remains sturdy throughout use and the notch 270 can be leveraged to remove the magnetic operator interface assembly 100 from a panel. For example, a user can insert a screwdriver into the notch 270 to create leverage to be able to more easily remove the magnetic operator interface assembly 100 from a panel.

In one embodiment, the backing 110 is a generally flat metal bracket that has machined holes 240 about its perimeter to hold a plurality of magnets 250. The holes 240 can be spaced around the perimeter at set intervals to provide a variety of consistent symmetric positions for the magnets to be installed. Alternatively, the holes 240 can be spaced according to other criteria such as the positions where magnets can provide a suitable amount of magnetic force to magnetically hold the assembly in place against the panel with sufficient force for a particular application, such as sufficient force to withstand the highest rated setting of a power washer or other tool. The number and spacing of holes 240 may also be set in order to accommodate a number and type of magnets to provide magnetic force sufficient to meet a particular rating.

Once the plurality of magnets 250 are added, the magnetic operator interface assembly 100 has a perimeter of a plurality of magnets 250, each with their own magnetic force (which may collectively be referred to as a backing magnetic surface), that are spaced to assure suitable mounting strength for the weight of the magnetic operator interface assembly 100 and desired force. The desired force can include at least the force to maintain the connection between the magnetic operator interface assembly 100 and a panel made from a particular type of magnetic material, such as steel, iron, or another ferromagnetic material. For example, each magnet 250 may be rated for a particular pull value, such as 40 lb. pull. A suitable number of magnets may be determined based on the rated pull values relative to the desired pull. Further, as noted above, the force in some embodiments can be driven by a desire to meet a particular threshold value, for example that is based on an expected amount of force that the assembly is likely to be subjected to, e.g., the pressure washer force used in wash down procedures. When an enclosure is magnetic, the magnetic operator interface assembly 100 can be said to be intrinsically held to a panel of the enclosure to protect an operator interface.

Figure 3:
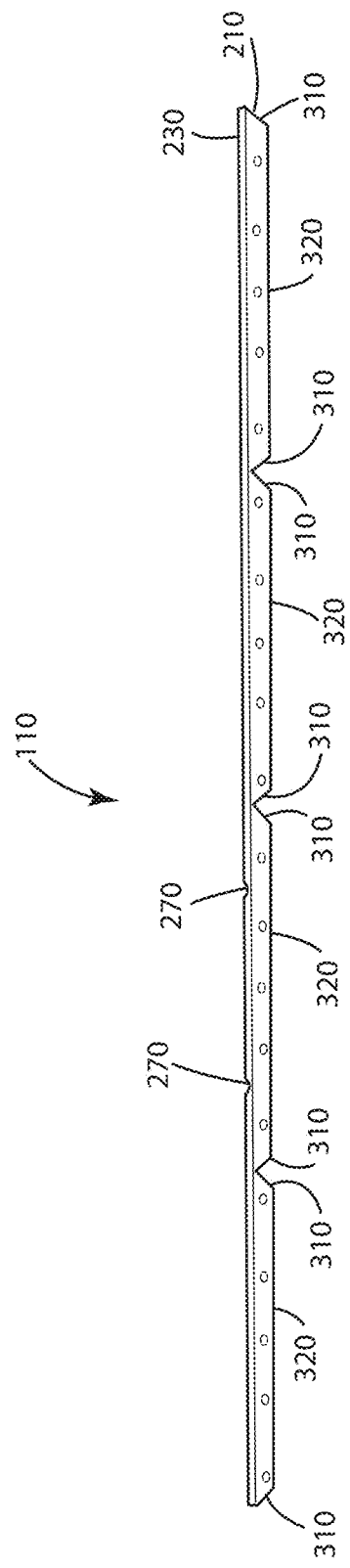
FIG. 3 shows a front view of an assembly drawing of a backing of a magnetic operator interface assembly according to one embodiment.

In FIG. 3, an exemplary side plan view of a partially manufactured backing 110 is shown. The backing 110 can be manufactured from one piece of material, such as sheet metal. In FIG. 3, the magnet mount surface 210 and the outer edge 230 of the backing 110 have been formed already. In particular, the sheet metal has been bent and cut to provide the shape and layout shown. As depicted, the backing 110 has four distinct trapezoidal portions 320, each with two distinct diagonal edges 310. In one embodiment, the trapezoidal portions 320 when viewed from left to right have alternating lengths such that there are two pairs of the trapezoidal portions 320, each pair having a distinct length. In an alternative embodiment, all four of the trapezoidal portions 320 have the same length. The backing 110 is formed by folding the piece of material so that the diagonal edges 310 are directly alongside one another. The free edges of the piece of material can be joined by any suitable means, such as welding, adhesive, or a fastener. Additionally, or alternatively, the diagonal edges 310 may also be joined by any suitable means, such as welding, adhesive, or a fastener. The outer edge 230 can then be folded up to a suitable angle. In one embodiment, the outer edge 230 is folded up to form a 90° angle with the magnet mount surface 210. In alternative embodiments, the backing 110 can be manufactured or formed by other methods.

In one embodiment, the backing 110 has a length of 1'-1.5" and a width of 1'-0.25". Thus, the length of the piece of material as pictured in FIG. 3 in this embodiment is 4'-3.5". The notches 270 in the depicted embodiment are located 3.25" from the corners of the backing 110 and there is 7" between the notches 270. The notches 270 have a radius of ⅛". The outer edge 230 has a depth of 5/16" and the magnet mount surface 210 has a width of 0.75". The first and third trapezoidal portions 320 have a length of 1'-0.25, and the second and fourth trapezoidal portions 320 have a length of 1'-1.5". Each trapezoidal portion 320 has five holes 240, and each of the holes 240 has a diameter of 3/16". In the first and third trapezoidal portions 320, the first and fifth holes 240 are 1" from the corner of the trapezoidal portion 320, the second and fourth holes 240 are located 2 and ⅞" from the first and the fifth holes 240 respectively, and the third hole 240 is located centrally between the second and the fourth hole 240 and is 2.25" from each of the second and the fourth hole 240. In the second and fourth trapezoidal portions 320, the first and fifth holes 240 are 1.75" from the corner of the trapezoidal portion 320, the second and fourth holes 240 are located 2 and ⅞" from the first and the fifth holes 240 respectively, and the third hole 240 is located centrally between the second and the fourth hole 240 and is 2 and ⅛" from each of the second and the fourth hole 240. All measurements are to the center of the hole 240. The diagonal edges 310 have a height of 0.75" and extend from the outer edge 230 at a 45° angle. The magnets 250 are 0.5"×3.25"× 0.25" channel magnets. The measurements given above are exemplary ranges and it is to be understood that other measurements can be used and not depart from the spirit of the disclosure. Further, the measurements used can be approximate to the measurements given.

Figure 4:
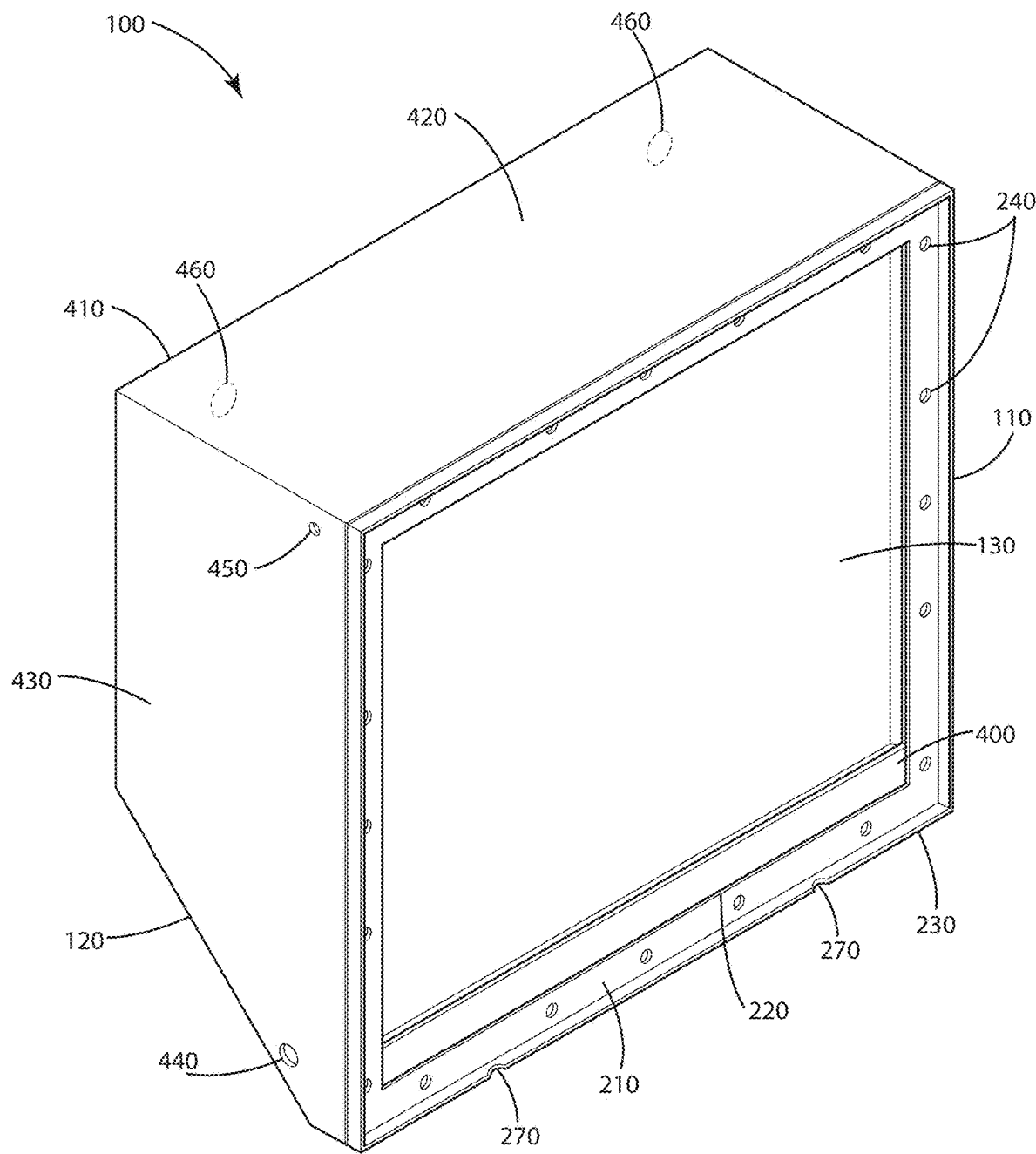
FIG. 4 is a rear perspective view of a magnetic operator interface assembly with a closed cover according to one embodiment.

In FIG. 4, a rear perspective view of a magnetic operator interface assembly 100 is shown. This view shows another angle of the backing 110 and depicts the connection between the magnet mount surface 210, the inner edge 220, and the outer edge 230. The shield 120 may also be referred to as a shield housing and an anti-glare housing. In one embodiment, the shield 120 includes a base 400 and a protrusion 410 that can act as a barrier. The depicted embodiment is configured to reduce the severity of one or more environmental conditions, such as glare, rain, and accidental human interface activation, to name a few. Specifically, to the extent the operator interface is positioned that glare from a light source is cast on the interface surface, the barrier can be configured to extend between the glare and the interface, thereby preventing or reducing the amount of glare. Similarly, to the extent the operator interface is positioned in such a way to be exposed to rain or other weather events, the barrier can be configured to extend between the rainfall path and the interface to prevent the rain from reaching the interface. Further, by having the barrier extend outward, unintentional human interaction is reduced because the operator interface cannot be reached as easily except from directly in front of it where a majority of intentional interaction occurs. In essence, the shield provides an intrinsic barrier to the environment. The protrusion 410 may be a single piece that has a top portion 420 and two side portions 430. Alternatively, the top portion 420 and side portions 430 may be separate protrusions that form separate barriers, which may or may not be joined. As depicted, the top portion 420 is generally rectangular and the side portions 430 start rectangular at the edge interfacing with the top portion 420 and then the edge tapers back on an angle toward the backing 110. In an alternative embodiment, the side portions 430 may be rectangular or essentially any other suitable shape. Additionally, the side portions 430 do not have to be the same shape, for example one side portion 430 could have a tapered edge and the other side portion 430 may be rectangular. Additionally, or alternatively, the shield may have a bottom portion such that the protrusion 410 extends around all sides of the base 400. In an alternative embodiment, the protrusion 410 may only have a top portion 420. The side portion 430 may have a locking hole 440 located toward the bottom of the side portion 430. One, both, or neither of the side portions 430 may have a locking hole 440. The locking hole 440 can be sized to fit a locking device, which may alternatively be referred to as a locking attachment. For example, the locking hole 440 can be sized to accept a shackle of a locking device. When the cover 130 is closed, a locking device, e.g., the shackle of the locking device, may be inserted through the locking hole 440 to secure the cover 130 closed with respect to the base 400. One example of a locking device is a padlock.

Figure 7:
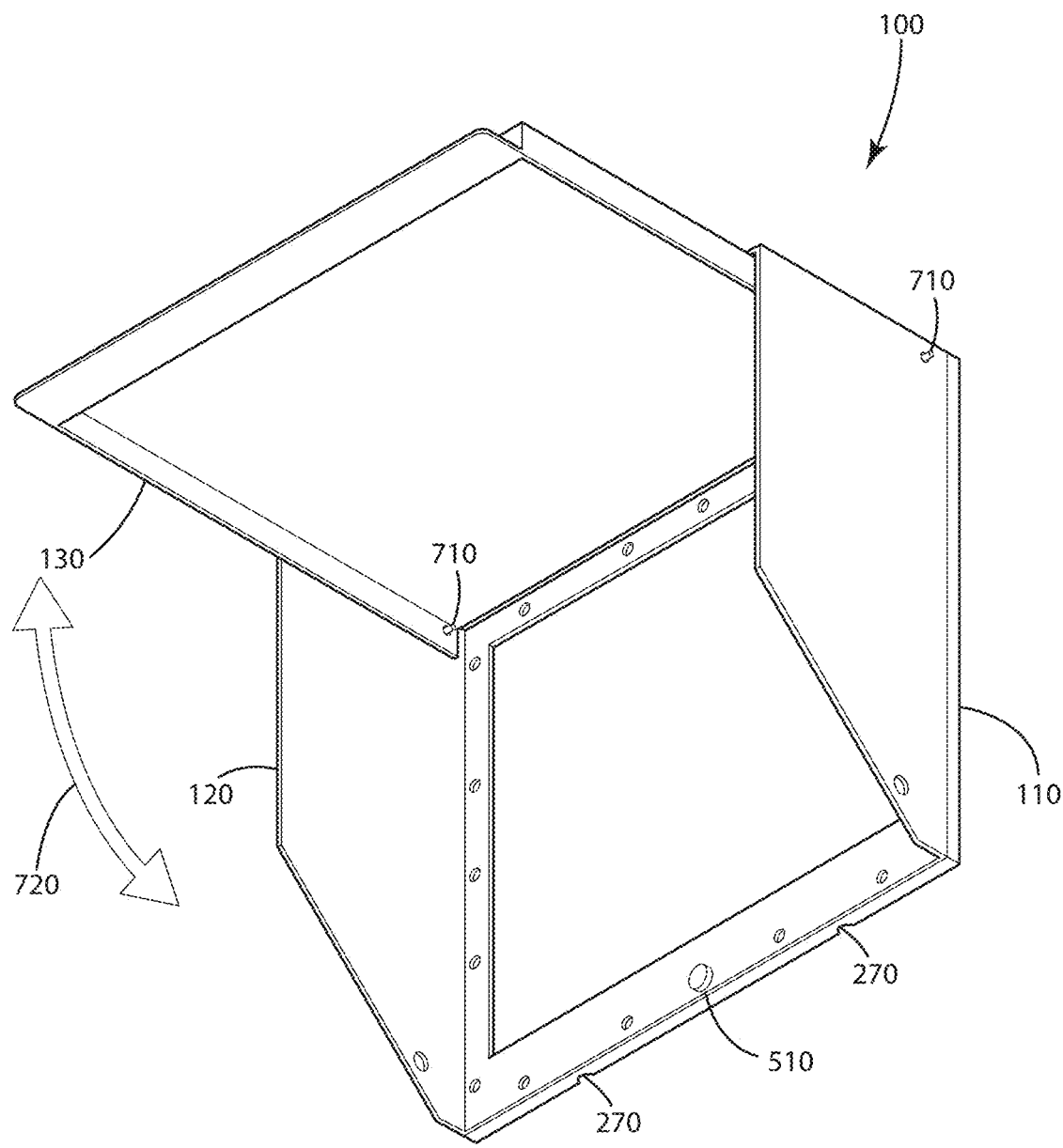
FIG. 7 is a front perspective view of a magnetic operator interface assembly according to one embodiment with a cover in an open position.

The cover 130 is movably connected to the shield 120. In the current embodiment, perhaps as best shown in FIG. 7, the cover 130 is rotatably mounted to the shield 120 at the corner of the side portions 430. The rotational mount is created and secured with a pair of pins 710 that are secured through aligned holes in a first side flange 600 and a second side flange 610 of the cover 130 and holes 450 in the side portions 430 of the shield 120. The cover 130 rotates about a pivot point as depicted by an arrow 720 in FIG. 7. One or more open state magnets 460 may be disposed on the underside of top portion 420 of the shield 120. The open state magnets 460 can be selected to have sufficient strength to hold the metal cover 130 in an open position via magnetic attraction. Further, the strength of the magnets can be selected such that it takes a suitable amount of force to overcome the magnetic force holding the cover 130 in place and close the cover 130. In alternative embodiments, the cover 130 may include corresponding magnets aligned with the magnets in the shield 120 that provide similar functionality. The open state magnets can be installed in non-metal cover embodiments or in metal cover embodiments. More details regarding various aspects and embodiments of the cover and associated elements are described in detail below.

Figure 5:
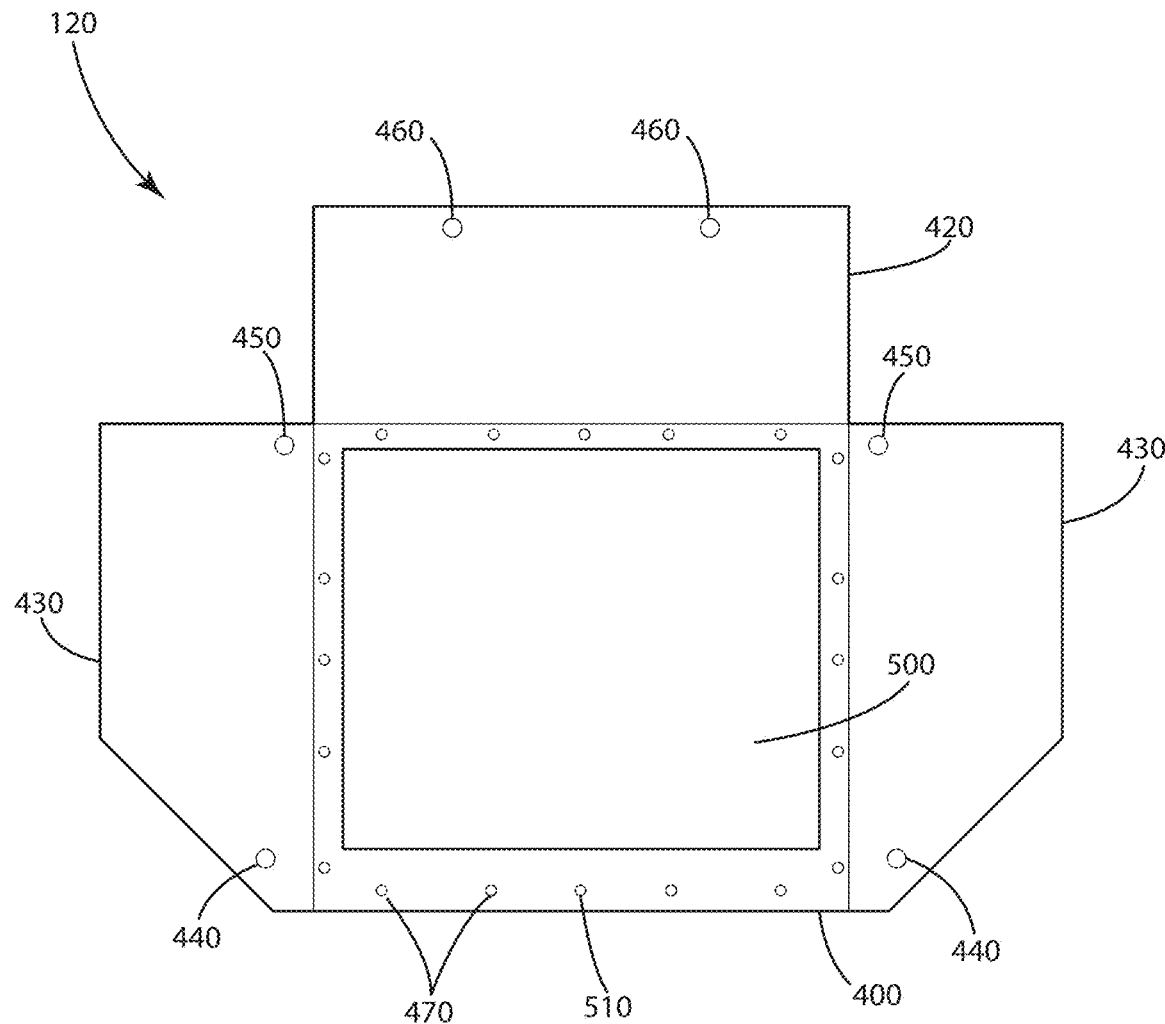
FIG. 5 depicts a front view of an assembly drawing of a shield of a magnetic operator interface assembly according to one embodiment.

FIG. 5 depicts an exemplary plan view of a shield 120 that is ready to be bent into shape. The base 400, the top portion 420, and the side portion may be manufactured as one piece of material. For example, the material may be a magnetic metal. The base 400 defines an interface opening 500 that is sized and shaped to receive and generally frame an operator interface. In one embodiment, the interface opening 500 has about the same dimensions or slightly larger dimensions as a particular operator interface such that the base 400 can snugly fit around and be directly adjacent to the operator interface, surrounding the operator interface on the top, left, bottom, and right sides of the interface. Essentially, the interface fits through the interface opening 500 so that it is surrounded except for the front and back of the interface. In an alternative embodiment, the interface opening 500 is larger than an operator interface such that the magnetic operator interface assembly 100 can be placed over the operator interface without the base 400 touching the operator interface. Though it should be noted that the base 400 may touch or rest against a portion of the operator interface. The protrusion 410 including the top portion 420 and the side portions 430, extend at about a 90° angle. The top portion 420 and the side portions 430 are joined through any suitable manner. For example, the top portion 420 may be joined to the side portions 430 through a seam weld.

Referring to FIG. 5, in the depicted embodiment, the base 400 of the shield 120 is rectangular and has the same width and length as the backing 110. On all edges with the protrusion 410, the base 400 has the same thickness as the backing 110. In alternative embodiments, the protrusion 410 and the base 400 may have a different thickness with respect to the backing 110 and each other. On the bottom edge, the base 400 is thicker than the bottom edge of the backing 110. In an alternative embodiment, the base 400 may be of uniform thickness. As depicted, the base 400 has five holes 470 along each edge. The holes 470 are aligned with the holes 240 in the magnet mount surface 210 in order to allow the backing 110 to be joined to the shield 120 through a plurality of fasteners inserted through the holes 240, 470. For example, the fasteners may be screws. Additionally, or alternatively, the backing 110 may be secured to the shield 120 without the use of the holes 240, 470. The center fastener on the bottom edge of the base 400 optionally includes a closed state magnet 510. The closed state magnet 510 holds the cover 130 in place in the closed position. In one embodiment, the closed state magnet 510 may be circular with a hole in the center sized to fit a screw. The screw may be inserted through the closed state magnet 510 and through a hole 270 in the base 400 and a hole 240 the backing 110 to secure the closed state magnet 510 to the surface of the base 400. The screw may also be secured on the back side of the backing 110 through a nut or other suitable securing means.

In alternative embodiments, the base 400 may have a different shape. In one embodiment, the base 400 may only include the three edges abutting the protrusion 410. Alternatively, the base 400 may have two edges including the top edge and one side edge. In yet another embodiment, the base 400 may only be comprised of the top edge. There may or may not be protrusions along each edge of the base 400. For example, the base 400 may be rectangular but the protrusion 410 may only be comprised of the top portion 420.

In one embodiment, the shield 120 has a length of 1'-1.5" and a width of 1'-0.25". The top portion 420 has a depth of 5.25". The side portions 430 have a depth of 5.25" at their deepest and $^{27}/_{32}$" at their narrowest. In an alternative embodiment, the side portions 430 have a depth of 5.25" at their deepest and 0.75" at their narrowest. The outer edge of the side portions 430 are straight for 7.75" and then begin to taper towards the narrowest point. In an alternative embodiment, the outer edge of the side portions 430 are straight for 7 and $^{15}/_{16}$". The tapered edge of the side portions 430 tapers at a 45° angle with a turning radius of $^{3}/_{16}$". The holes 450 are located $^{23}/_{32}$" from the base 410 and $^{15}/_{32}$" from the top portion 420. The holes 450 have a radius of $^{3}/_{32}$". The center of the locking holes 440 is located 1.25" from the base 410 and 1 and $^{1}/_{8}$" from the narrowest edge of the side portion 430. The locking holes 440 have a diameter of $^{3}/_{8}$". The bottom edge of the base 420 has a thickness of 1.5". The other three edges of the base have a thickness of 0.75". The interface opening 500 has a length of 1' and a width of 10". The holes 470 have a diameter of $^{3}/_{16}$". Along the width of the shield 120 in the base 410, the first and fifth holes 470 are 1" from the corner of the trapezoidal portion 320, the second and fourth holes 470 are located 2 and $^{7}/_{8}$" from the first and the fifth holes 470 respectively, and the third hole 470 is located centrally between the second and the fourth hole 470 and is 2.25" from each of the second and fourth holes 470. Along the length of the shield 120 in the base 410, the first and fifth holes 470 are 1.75" from the corner of the trapezoidal portion 320, the second and fourth holes 470 are located 2 and $^{7}/_{8}$" from the first and the fifth holes 240 respectively, and the third hole 470 is located centrally between the second and fourth holes 240 and is 2 and $^{1}/_{8}$" from each of the second and fourth holes 470. All measurements are to the center of the holes 470. The center of the holes 470 are located $^{3}/_{8}$" from the outer edge of the base 400. The closed state magnet 510 is a 0.5" diameter by $^{1}/_{8}$" magnet. The various dimensions of the current embodiment are exemplary, other embodiments can include changes in the various dimensions, including thicknesses, heights, widths, as well as numbers of holes, and other characteristics without departing from the spirit of the disclosure.

Figure 6:
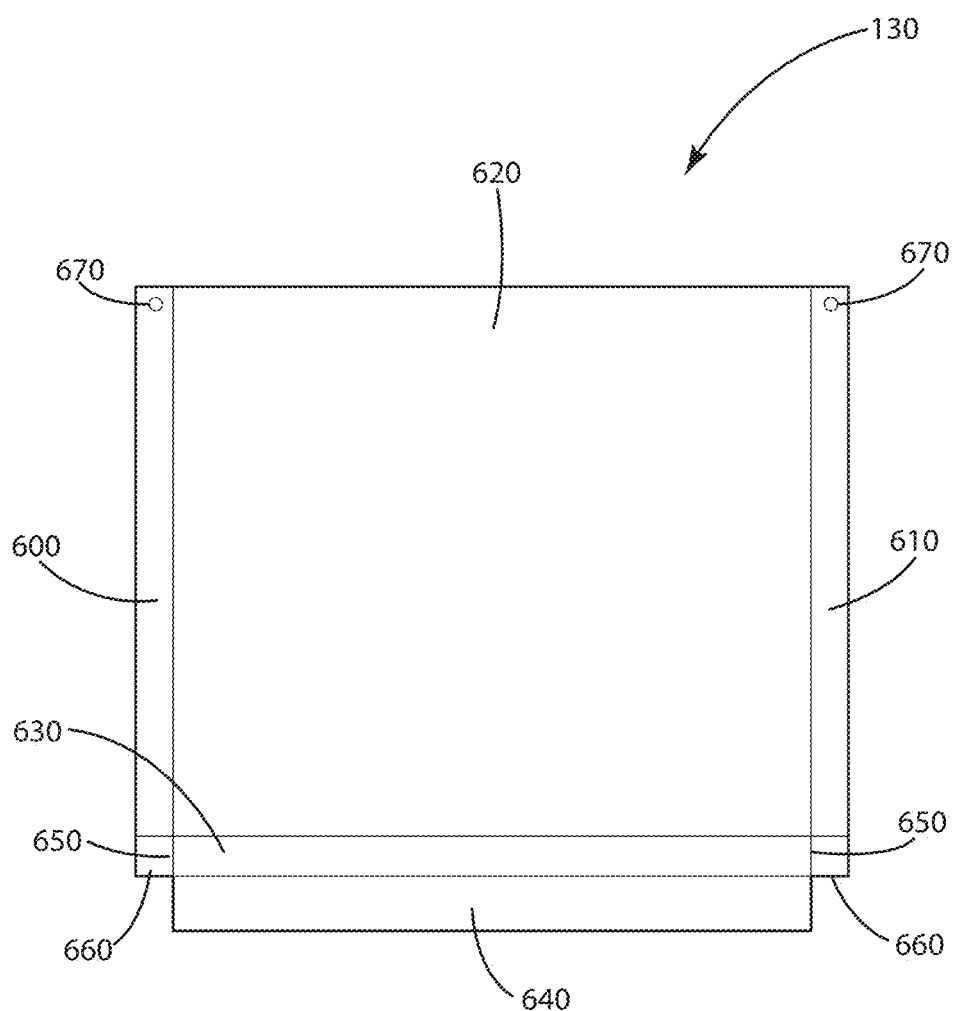
FIG. 6 is a front view of an assembly drawing of a cover of a magnetic operator interface assembly according to one embodiment.

FIG. 6 illustrates an exemplary plan front view of a cover in accordance with one embodiment of the present disclosure. The cover 130 can be manufactured by bending a continuous piece of a suitable material in accordance with a method of manufacture, which will now be described. It should be understood that covers in accordance with the present disclosure can be manufactured by other methods. The current process to manufacture the cover 130 begins with an appropriately dimensioned portion of sheet metal with suitable magnetic characteristics. The piece can be cut along a cut line 650 to form two cut portions 660. The first side flange 600 and the second side flange 610 are then bent to a 90° angle relative to a first perpendicular surface 620. The cut portions 660 are bent to a 90° angle relative to the first side flange 600 and the second side flange 610 respectively. Then, a third edge 630 is bent to a 90° angle relative to the first perpendicular surface 620. The cut portions 660 are joined to the third edge 630. For example, the cut portions 660 are welded to the third edge 630. Alternatively, the cut portions 660 may be removed from the cover 130 by cutting along the terminating edge of the first side flange 600 and the second side flange 610 respectively. If the cut portions 660 are removed, the first side flange 600 and the second side flange 610 may be joined to the third edge 630 through a suitable means, such as by welding. Finally, a second perpendicular surface 640 is bent to a 90° angle relative to the third edge 630.

The cover 130 can also be described as a magnet held cover, a door, and an anti-glare eyebrow. The cover has the first side flange 600 and the second side flange 610. The first side flange 600 and the second side flange 610 are parallel to the side portions 430. The first side flange 600 is connected to the second side flange 610 through the first perpendicular surface 620. The first perpendicular surface 620 is parallel to the base 400 when the cover 130 is in a closed position and the first perpendicular surface 620 is parallel to the top portion 420 when the cover 130 is in an open position. In one embodiment, the first perpendicular surface 620 at least covers the interface opening 500 when the cover 130 is in the closed position. The first perpendicular surface 620 terminates in the third edge 630. The third edge 630 is also connected to the second perpendicular surface 640. When the cover 130 is in the closed position, the second perpendicular surface 640 is adjacent to the bottom edge of the base 400. In one embodiment, the second perpendicular surface 640 has a width equal to the thickness of the bottom edge of the base 400.

The cover 130 can be movably connected to the shield 120 through the holes 450 in the shield 120 and aligned holes 670 in the cover 130. In one embodiment, the cover 130 may be rotatably connected to the shield 120. Pins 710 can be inserted through the holes 450 in the shield 120 and the holes 670 cover 130 in order to allow the cover 130 to rotate relative to the shield 120. The pins 710 may be a screw or other suitable material. Additionally, or alternatively, the cover 130 may be movably connected to the shield 120 through other suitable means such as a hinge or a sliding mechanism. The cover 130 easily opens and closes through the connection to the shield 120. When the cover 130 is in the closed position, the cover 130 may be held closed through the closed state magnet 510. When the cover 130 is in the open position, the cover 130 may be held open through the at least one open state magnet 460. The cover 130 can maintain its position whether it is in the open position or the closed position without human interference. If a locking device is inserted through the opening 140, the cover 130 may be further secured in the closed position. This can also provide a first line level of security to limit access to the operator interface from unauthorized users.

The cover 130 dimensions of the depicted embodiment are described herein, but it should be understood these dimensions are provided as examples. Other embodiments can have dimensions that vary. The cover 130 has a length of 1'-1 and 3/16" and a width of 1'-9/32". The first side flange 600 and the second side flange 610 have a width of 1'-3/16" and a depth of 0.75". The third edge 630 has a width of 1 and 1/8". The center of the holes 670 are located 0.25" from the upper edge of the first side flange 600 and the second side flange 610 respectively. The center of the holes 670 are located 0.5" from the terminating edge of the first side flange 600 and the second side flange 610 respectively.

In an alternative embodiment, the first perpendicular surface 620 has a length of 1'-1.25" and a width of 1'-1 and 3/8". The third edge 630 has a depth of 0.75". The second perpendicular surface 640 has a length of 1'-1.25" and a width of 1 and 1/8". The outer corners of the second perpendicular surface 640 have a turn radius of 3/16". The first side flange 600 and the second side flange 610 have a depth of 0.75". The center of the holes 670 are located 0.25" from the upper edge of the first side flange 600 and the second side flange 610 respectively. The center of the holes 670 are located 0.5" from the terminating edge of the first side flange 600 and the second side flange 610 respectively. In one embodiment, the machining drawing of FIG. 6 has a length of 1'-2.75" and a width of 1'-1.25".

The cover 130 can be any size or shape to protect an operator interface. In some embodiments, the cover 130, the shield 120, and the backing 110 may be circular, square, or any other suitable shape to protect an operator interface. In one embodiment, the magnetic operator interface assembly 100 may be mounted with the width of the magnetic operator interface assembly 100 parallel to the upper edge of an operator interface.

While the cover 130 as described above is movably connected to the shield through the holes 450, 670 and the pins 710, the cover 130 can move with respect to the shield 120 in a variety of other ways. For example, the cover 130 may be hingedly connected to the shield 120. Additionally, or alternatively, the cover 130 may be slidably connected to the shield 120. The cover 130 can alternatively be connected to the base 400 or the backing 110.

In some embodiments, the cover 130 is made from or includes a transparent material. This allows an operator interface to be seen even when the cover 130 is in the closed position. This can be desirable in some situations because the operator interface remains protected while the cover is closed while still allowing the user to view or otherwise monitor information provided by the control panel. For example, this embodiment may be used to protect a switchgear electrical panel from being accidentally activated while still allowing the operator to see the switchgear electrical panel. In some embodiments, the transparent cover 130 can include two portions, a transparent portion and an opaque portion. For example, one portion of the cover can be made of metal, with a hole cut out that forms a window for the transparent portion in the front face of the cover. The transparent portion may be sized and shaped to cover the hole and extend past the hole, e.g., in one embodiment it can extend about $1/8^{th}$ of an inch to a $1/4$ inch beyond the perimeter of the hole. Such an arrangement allows the transparent portion surface and the interior (or exterior) metal surface to overlap. The two surfaces can be joined by adhesive or fastened in another suitable manner. In some embodiments, the adhesive can form a watertight bond and can be sufficiently strong such that the cover can withstand high pressure cleaning equipment applying pressure to the transparent portion or the cover generally. The transparent portion can be a polycarbonate resin thermoplastic material, such as a sheet of Lexan.

The magnetic operator interface assembly 100 can provide glare protection for an operator interface. The shield 120 can prevent glare from both sides of the device and from above, and the cover 130 in the open position creates an eyebrow to further shade an operator interface from the lights above. This assists the operator when accessing the operator interface. The magnetic operator interface assembly 100 provides glare protection whether an operator interface is installed indoors or outdoors.

The magnetic operator interface assembly 100 also provides UV protection to an operator interface. UV light is potentially destructive to the material of the operator interface. The protrusion 120 and the cover 130 can protect plastics and other materials that are subject to deterioration due to exposure to UV light from a UV light source.

The magnetic operator interface assembly 100 can also provide rain and other weather event protection to an operator interface. The protrusion 120 and the cover 130 in the closed position act as walls and a roof to protect an operator interface from rain falling from above. The magnetic operator interface assembly 100 can reduce moisture (for example, rain) from landing on an operator interface when the operator interface is being accessed by personnel.

When an operator interface is installed in an enclosure after the enclosure is purchased, the operator interface itself is creating a breach in the enclosure. Therefore, the operator interface itself creates a vulnerability in the enclosure. The magnetic operator interface assembly 100 provides an additional layer of protection to the seal of the operator interface.

FIG. 7 depicts a front perspective view of a magnetic operator interface assembly 100 according to one embodiment. The depicted magnetic operator interface assembly 100 includes a backing 110, a shield 120, and a cover 130. The cover 130 is shown in the open position to allow access to an operator interface. In one embodiment, the magnetic operator interface assembly 100 has a long life powder coat. Additionally, or alternatively, the magnetic operator interface assembly 100 may have stainless-steel hardware.

Figure 8:
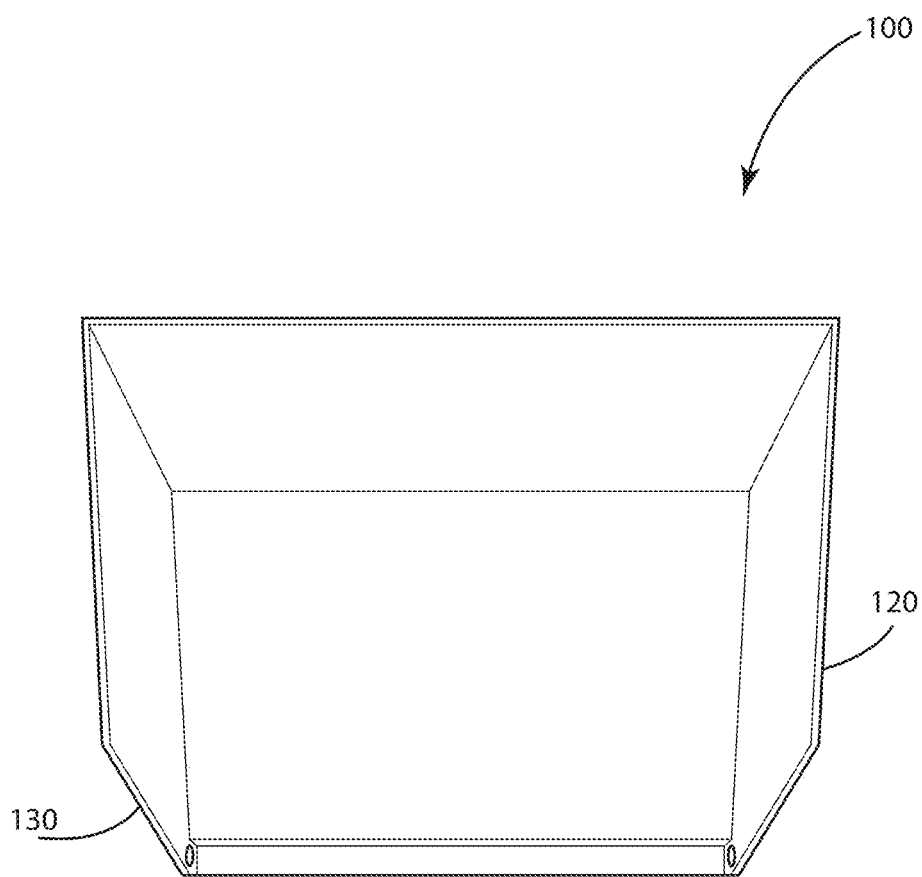
FIG. 8 is a front view of the magnetic operator interface assembly of FIG. 7 with the cover in a closed position.

FIG. 8 is a front view of the magnetic operator interface assembly 100 of FIG. 7 with the cover 130 shown in the open position to cover the operator interface. In some embodiments, the magnetic operator interface assembly 100 comprises the backing 110 and the shield 120. In other embodiments, the magnetic operator interface assembly 100 comprises the backing 110 and the cover 130. Alternatively, in some embodiments, the magnetic operator interface assembly 100 comprises the shield 120 and the cover 130.

Figure 9:
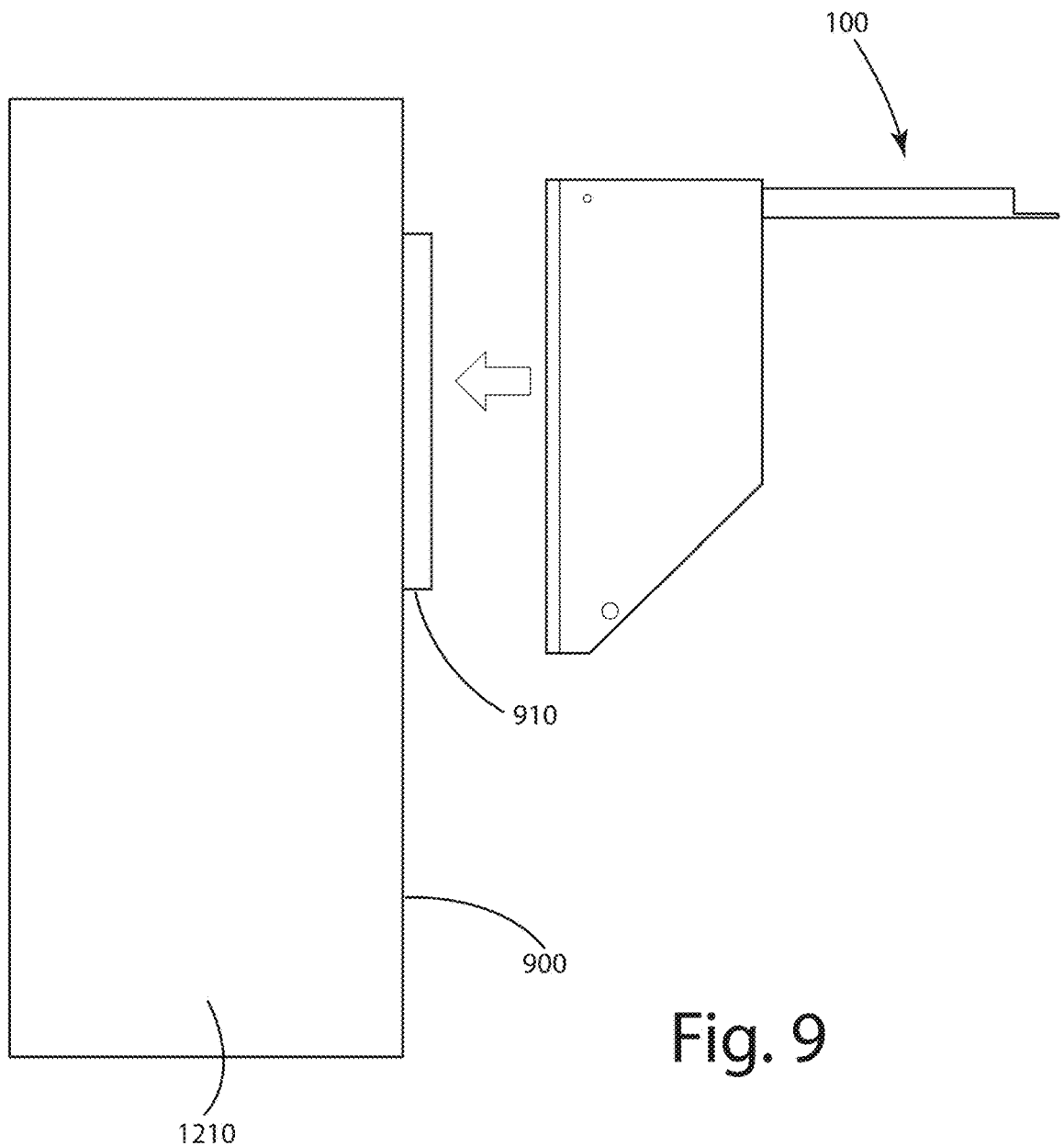
FIG. 9 depicts a magnetic operator interface assembly according to one embodiment as it attaches to a panel of a sealed enclosure, an operator interface being disposed within the panel.

FIG. 9 shows one example of how the magnetic operator interface assembly 100 is attached to a panel 900. The panel 900 is one surface of a sealed enclosure 1210 that includes an operator interface 910 extending through an opening in the panel 900. In one embodiment, the sealed enclosure is a metal industrial rated sealed electrical enclosure. For installation, the magnetic operator interface assembly 100 is placed over an operator interface 910 such that the operator interface 910 is within the interface opening 500 of the assembly 100. The magnetic operator interface assembly 100 attaches to the panel 900 through the magnetic force generated by the plurality of magnets 250. This allows the magnetic operator interface assembly 100 to be securely attached to the panel 900 without breaching the panel 900 or the enclosure 1210 generally.

The magnetic operator interface assembly 100 can be easily installed and removed. Installation requires no drilling and therefore has less risk of degrading the panel integrity, compromising the enclosure seal, or compromising an operator interface seal. The magnetic operator interface assembly 100 can be mounted to the panel 900 exclusively by magnetic force without additional supporting hardware or structures to secure the assembly to the panel. This can reduce time and energy spent cleaning relative to a non-magnetic assembly that utilizes various supporting hardware or structures that may be mounted in such a way as to collect dirt and/or debris.

Breachless or hole-less installation allows an existing or new panel to maintain its hazardous area classification or enclosure rating (e.g., explosion-proof, rain-proof, dust-proof, a particular NEMA rating, or essentially any other rating effected by a breach) and protects an operator interface from water, dust, or other infiltrations. Breachless installation may provide a precise seal. In addition to the NEMA benefits for installation, the magnetic operator interface assembly 100 is generally less expensive to install than other types of traditional protective devices that mount with conventional fasteners and do not have tool-less installation capability. Breachless installation can also be performed with little to no technical skills, especially where the sealed enclosure is made from a magnetic material, such as steel, or magnets are installed on the interior wall of a non-magnetic enclosure.

The magnetic operator interface assembly 100 can be useful for retrofitting existing panels, replacement, and removal due to its simple installation. For example, the magnetic operator interface assembly 100 can be removed and moved to other equipment while not leaving a damaged panel with installation holes. By adding an additional protection layer that does not require holes through the enclosure, the magnetic operator interface assembly 100 may be beneficial and easy to maintain over its life.

In alternative embodiments, the operator interface 910 may form the entirety of the panel 900. The magnetic operator interface assembly 100 can be sized and shaped to fit over the panel 900 and magnetically mount to the sides of the enclosure 1210. The backing 110 orients the magnets 250 to secure the magnetic operator interface assembly 100 to the sides of the enclosure 1210.

Figure 10:
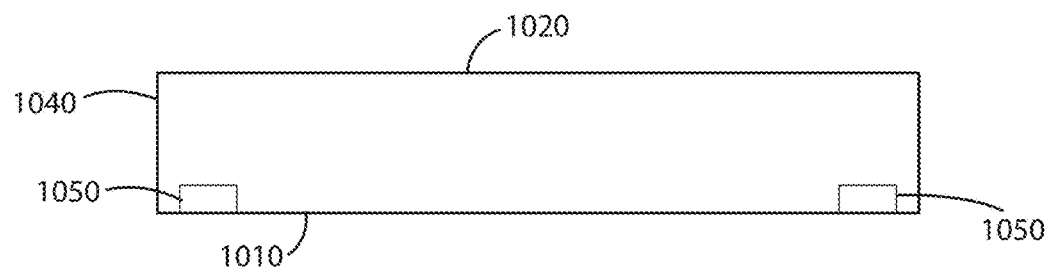
FIG. 10 shows a side view of a magnetic operator interface assembly according to one embodiment.

FIG. 10 shows an alternative configuration for a magnetic operator interface assembly 1000. The depicted configurations can protect an operator interface in both magnetic and non-magnetic enclosures. In FIG. 10, the magnetic operator interface assembly 1000 comprises a shield 1020 and a plurality of magnets 1050. As depicted, the shield 1020 includes a base 1010 and a protrusion 1040 extending outward from the base 1010. In one embodiment, the shield 1020 fully surrounds an operator interface. In alternative embodiments, the shield 1020 may only protect an operator interface along one edge, or along multiple edges without fully surrounding an operator interface. The plurality of magnets 1050 are joined to the magnetic operator interface assembly 1000 to allow the magnetic operator interface assembly 1000 to attach to an enclosure. In the depicted embodiment, the plurality of magnets 1050 are joined to the inner surface of the base 1010, for example through an adhesive. In alternative embodiments, the base 1010 may be manufactured to contain cavities for the plurality of magnets 1050 such that the plurality of magnets 1050 are mounted on the outer surface of the base 1010 and the plurality of magnets 1050 are flush with the outer surface of the base 1010. In such embodiments, the plurality of magnets 1050 can be secured in the cavities through the use of a friction fit, an adhesive, a fastener, or any other suitable manner. The magnetic operator interface assembly 1000 protects an operator interface from the environment, including various external forces, including, for example, UV rays and rain.

Figure 11:
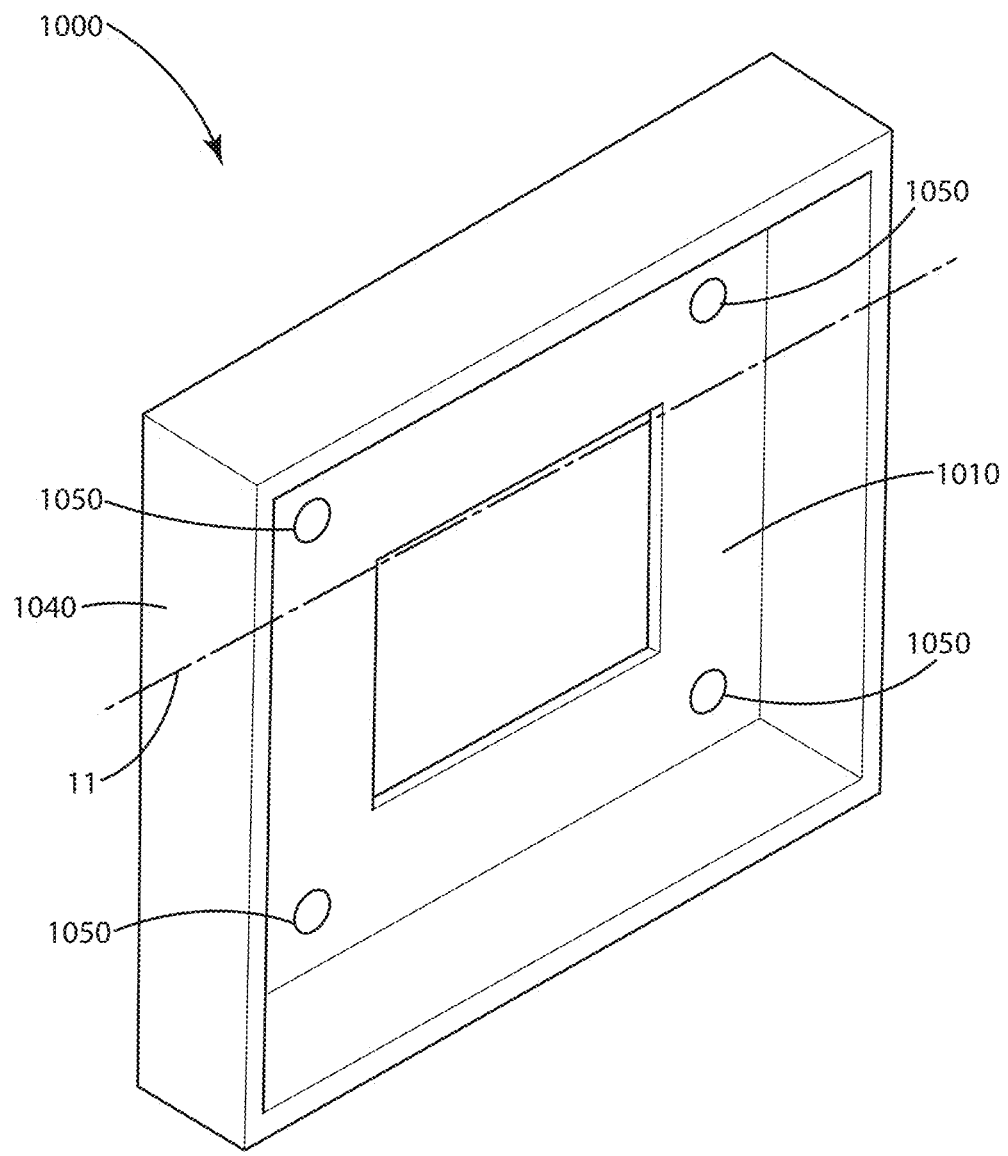
FIG. 11 shows a front perspective view of the magnetic operator interface assembly of FIG. 10.

FIG. 11 shows a perspective view of the magnetic operator interface assembly 1000 of FIG. 10. The base 1010 defines an interface opening 1100. The interface opening 1100 fits over an operator interface. In one embodiment, the interface opening 1100 is sized to the dimensions of an operator interface such that when the magnetic operator interface assembly 1000 is attached to a panel, the edges of the interface opening 1100 abut the operator interface. In another embodiment, the interface opening 1100 is sized to fit a variety of operator interfaces such that the interface opening 1100 does not necessarily touch an operator interface when the magnetic operator interface assembly 1000 is attached to a panel.

Where an enclosure is made from a magnetic material, the magnetic operator interface assembly 100, 1000 as described above can attach to an enclosure and protect an operator interface without any alteration to the enclosure. However, the magnetic operator interface assembly 100, 1000 can also attach to an enclosure made from a non-magnetic metal material or from any other non-magnetic material. Examples of non-magnetic material include, but are not limited to stainless steel, aluminum, fiberglass, and plastic.

Figure 12:
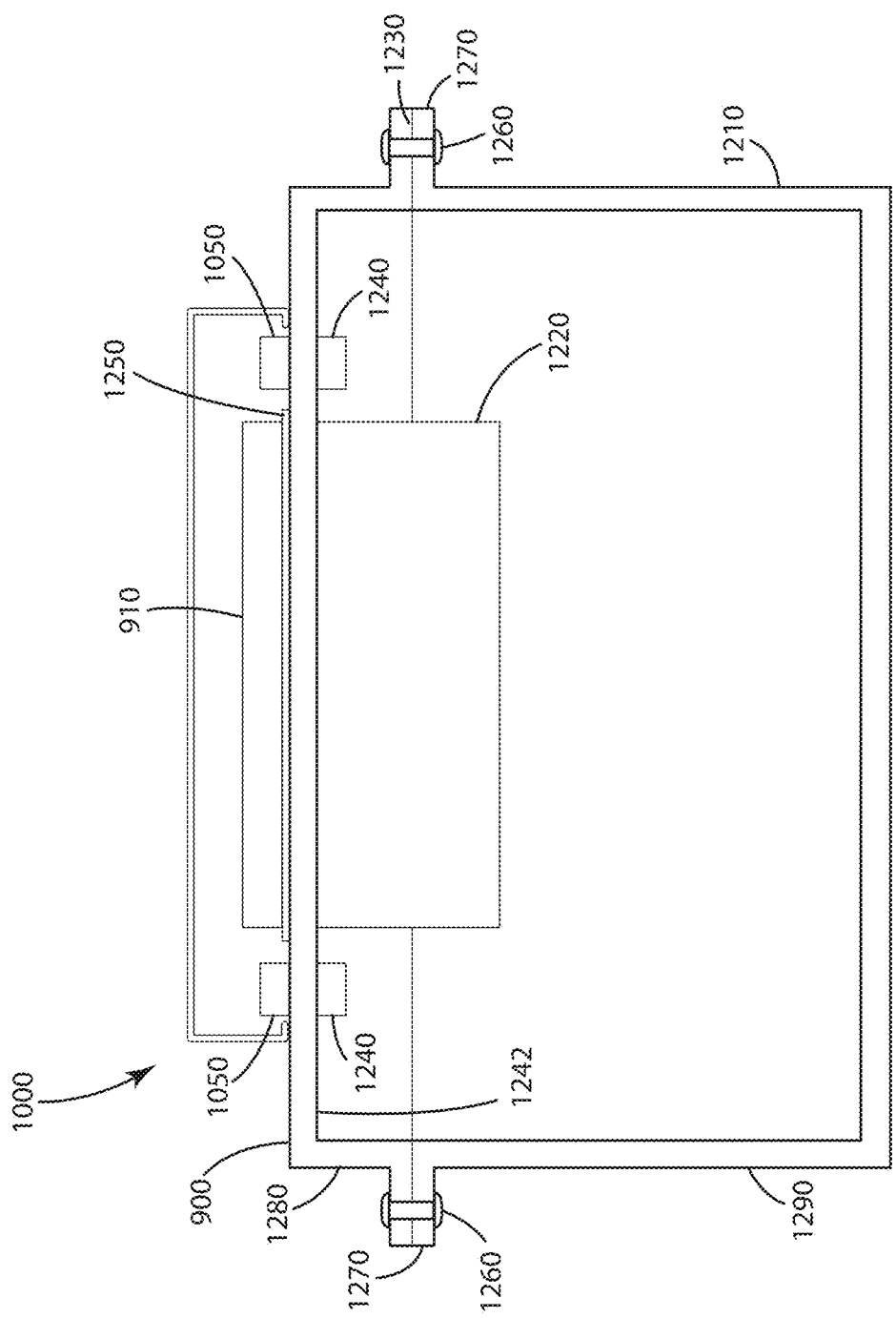
FIG. 12 depicts a top view of the magnetic operator interface assembly of FIG. 10 for use with an enclosure made from non-magnetic material along the line 11-11.

FIG. 12 depicts a non-magnetic enclosure 1210 and a top view of the magnetic operator interface assembly 1000 of FIG. 10 along the line 11-11. The magnetic operator interface assembly 1000 surrounds an operator interface 910. The enclosure 1210 is a sealed NEMA enclosure which environmentally protects a set of electronics 1220. With regard to some embodiments, the enclosure 1210 can be made from fiberglass, plastic, a non-magnetic metal, or some other non-magnetic material, or combination of materials. As depicted, the enclosure 1210 is formed from two separate pieces that are joined together. The two separate pieces are a front portion 1280 and a rear portion 1290. A seam 1230 connects the front portion 1280 and the rear portion 1290. A gasket can be used around the seam 1230 to assist in forming and maintaining the seal of the enclosure. Each of the front portion 1280 and the rear portion 1290 includes an edge 1270. The edge 1270 on each of the front portion 1280 and the rear portion 1290 can join the enclosure, in the depicted embodiment the portions are joined via a plurality of fasteners 1260 that are routed through aligned holes in the front portion 1280 and the rear portion 1290. In one embodiment, the plurality of fasteners 1260 are rivets.

Because the panel 900 of this embodiment is non-magnetic, a plurality of enclosure magnets 1240 can be installed inside the enclosure for removably mounting the magnetic operator interface assembly 1000. For example, a plurality of enclosure magnets 1240 can be joined to an inside front wall 1242 of the enclosure 1210. In alternative embodiments, where the magnetic operator interface assembly removably mounts to the sides of the enclosure, the magnets 1240 can be installed on the inner side walls of the enclosure 1210. For example, the plurality of enclosure magnets 1240 may be joined to the enclosure 1210 through industrial tape, glue, a bracket, or another suitable method. The plurality of enclosure magnets 1240 can also be referred to as internal magnet attachments and interior mounted self-adhesive magnets. The plurality of enclosure magnets 1240 are disposed on the wall of the enclosure 1210 at a certain position and magnetic polarity such that the plurality of enclosure magnets 1240 align with the plurality of magnets 1050 of the assembly 1000 in its installed state and the magnets attract each other. Rather than the magnetic operator interface assembly 1000 attaching to the enclosure through the magnetic attraction between the plurality of magnets 1050 and the magnetic panel 900, the magnetic operator interface assembly 1000 can be attached to the enclosure 1210 through magnetic attraction between the plurality of magnets 1050 and the plurality of enclosure magnets 1240. Accordingly, even where the enclosure 1210 structure is non-magnetic, the magnetic operator interface assembly 1000 can be installed without breaching the sealed enclosure 1210, so long as the enclosure magnets 1240 are in place. The outer surface of the panel 900 of the enclosure 1210 may have alignment indicia to show an operator where the enclosure magnets 1240 are located or where the magnetic operator interface assembly 1000 can be installed.

In some embodiments, the enclosure magnets 1240 can have a sufficiently strong magnetic attraction to the magnetic operator interface assembly 1000 to hold the magnetic operator interface assembly 1000 against the panel 900 even without the inclusion of the assembly magnets 1050. Thus, in this embodiment, the magnetic operator interface assembly 1000 may not incorporate the plurality of magnets 1050, and, if it does, the plurality of magnets 1050 do not have to be aligned with the plurality of enclosure magnets 1240 for the magnetic operator interface assembly 1000 to attach to the panel 900. The magnetic force of the enclosure magnets 1240 can be selected to be sufficiently strong to hold the magnetic operator interface assembly 1000 against the panel 900 even when the magnetic operator interface assembly 1000 is misaligned. The magnetic force may be selected based on the thickness of the panel 900. The magnetic attraction is stronger when the magnetic operator interface assembly 1000 is aligned, but the magnetic attraction is sufficiently strong to hold the magnetic operator interface assembly 1000 against the panel 900 even when the assembly is misaligned. Further, the magnetic attraction when the assembly 1000 is misaligned may be referred to as a misalignment magnetic coupling level and the magnetic attraction when the assembly 1000 is aligned may be referred to as an aligned magnetic coupling level.

The magnetic attraction between the plurality of magnets 1050 and the plurality of enclosure magnets 1240 may be sufficient to attach the magnetic operator interface assembly 1000 to the surface of the panel 900 thereby creating a seal. However, in certain applications, it may be desirable to create a further seal between the magnetic operator interface assembly 1000 and the panel 900. A gasket 1250 can be used for this purpose. As depicted in FIG. 12, the gasket 1250 surrounds the operator interface 910 alongside the surface of the panel 900. The gasket 1250 may be the second gasket surrounding the operator interface 910 because the operator interface 910 may also incorporate a gasket to seal it to the enclosure 1210. In one embodiment, the gasket 1250 may be attached to the panel 900. For example, the gasket 1250 may be attached to the panel 900 through an adhesive or any other suitable fastener. The interface opening 1100 contacts the gasket 1250 when the magnetic operator interface assembly 1000 is attached to the panel 900. The gasket 1250 provides a further seal between the magnetic operator interface assembly 1000 and the panel 90. In one embodiment, the gasket 1250 is manufactured from rubber. The gasket 1250 may be made from any suitable material.

The operator interface 910 can include one or more control elements mounted to a panel or other substrate. The operator interface 910 may include various electronics related to power and control of the interface as well as various electronics related to control of equipment residing inside of the enclosure 1210. These electronics are generally represented by the block 1220. The set of electronics 1220 may be a distinct component from the operator interface 910 such that the set of electronics 1220 and the operator interface 910 are disposed on opposite sides of the panel 900. The set of electronics 1220 may be connected to the operator interface 910 through any suitable means, such as through a plurality of wires inserted through the panel 900. Alternatively, the operator interface 910 and the set of electronics 1220 may form one integral piece. The panel 900 would form an opening large enough to fit the combination of the operator interface 910 such that the electronics 1220 is disposed within the enclosure 1210 while the operator interface 910 is at least partially disposed outside the enclosure 1210. Additionally, or alternatively, both the operator interface 910 and the set of electronics 1220 may be disposed outside the enclosure 1210, for example on the surface of the panel 900.

The set of electronics 1220 may include one or more microcontrollers, microprocessors, and/or other programmable electronics that are programmed to carry out various functionality, some of which may relate to the underlying machines residing in the enclosure, which is not generally germane to the present disclosure and also functionality that relates to the magnetic operator interface assembly 1000, which are described herein. The set of electronics 1220 may additionally or alternatively include other electronic components that are programmed to carry out the functions described herein, or that support the microcontrollers, microprocessors, and/or other electronics. The other electronic components can include, but are not limited to, one or more field programmable gate arrays, systems on a chip, volatile or nonvolatile memory, discrete circuitry, integrated circuits, application specific integrated circuits (ASICs) and/or other hardware, software, or firmware. Such components can be physically configured in any suitable manner, such as by mounting them to one or more circuit boards, or arranging them in another manner, whether combined into a single unit or distributed across multiple units. Such components may be physically distributed in different positions in the enclosure 1210, or they may reside in a common location within the enclosure 1210, such as behind the operator interface 910. When physically distributed, the components may communicate using any suitable communication protocol.

In one embodiment, the base 1010 is a generally flat plate that has a plurality of holes 1030 machined into it to secure the magnets 1050. Once the magnets 1050 are added, the magnetic operator interface assembly 1000 has a perimeter of the magnets 1050, each with their own magnetic force. The magnets can be spaced about the perimeter to provide a suitable amount of magnetic strength for secure mounting of the magnetic operator interface assembly 1000, accounting for the weight of the assembly itself as well as expected weight to be placed on the assembly during normal use to maintain the attractive force required to maintain the connection between the magnetic operator interface assembly 1000 and a panel. For example, the plurality of magnets 1050 may each be rated for 40 lb. pull. The enclosure magnets 1240 can be mounted to an internal equipment surface which in turn mounts to the enclosure 1210. The internal equipment bracket may also be referred to as an internal magnet ring and an internal equipment bracket. The internal equipment surface can be held by the magnetic pressure between the plurality of magnets 1050 and the plurality of enclosure magnets 1240 only, or the internal equipment surface bracket may be secured through other suitable means such as an adhesive or 3M VHB tape. If the internal equipment surface is secured to the enclosure 1210 other than through the magnetic attraction between the plurality of magnets 1050 and the plurality of enclosure magnets 1240, the magnetic operator interface assembly 1000 can be removed and added to the panel 900 as needed.

Figure 13:
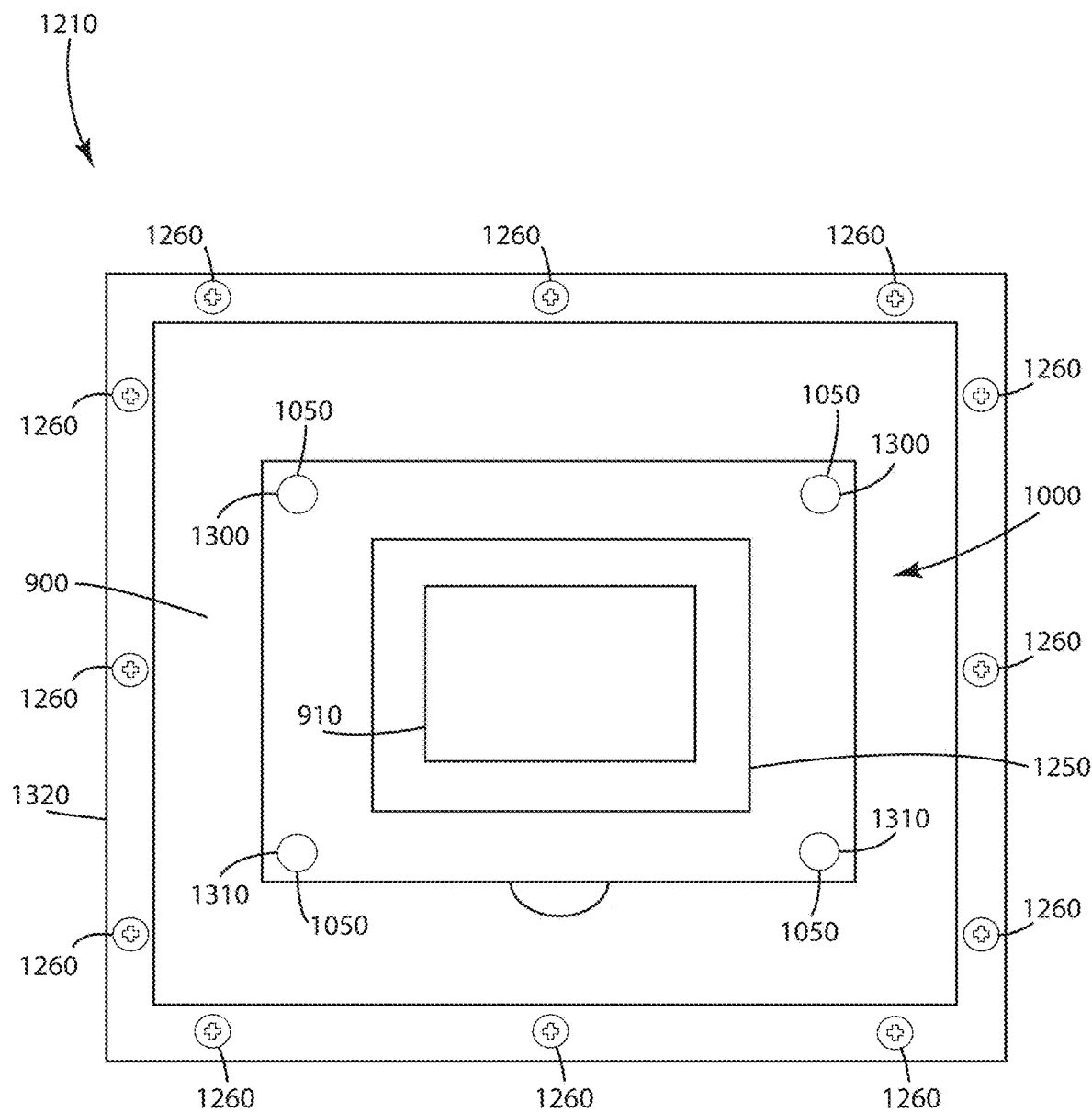
FIG. 13 shows a front view of FIG. 12.

FIG. 13 shows a front view of a magnetic operator interface assembly 1000. Exemplary positions of the magnets 1050 are shown with an exemplary magnetic pole orientation. The magnets 1050 in this embodiment can be north pole magnets 1300 or south pole magnets 1310. The magnetic operator interface assembly 1000 may be a NEMA enclosure. The depicted configuration of magnets 1050 (in combination with the positioning and pole orientation of magnets on the enclosure) intentionally enables only one magnetic mounting position for the magnetic operator interface assembly 1000. In the depicted embodiment, the assembly 1000 has four magnets 1050 installed on it: two north pole magnets 1300 and two south pole magnets 1310. The plurality of enclosure magnets 1240 (not pictured) are installed in the opposite magnetic pole configuration, such that the south pole enclosure magnets 1240 align with the north pole assembly magnets 1300 and the north pole enclosure magnets 1240 align with the south pole assembly magnets 1310. This particular magnet configuration only allows for one mounting position of the magnetic operator interface assembly 1000 because in any other mounting position, the magnetic poles will not attract in the north-south pole pairs. Without the magnetic attraction between the enclosure magnets 1240 and the assembly magnets 1050, the magnetic operator interface assembly 1000 will not mount to the panel 900. This mounting position can be referred to as a fixed or restricted magnetic mounting configuration.

Figure 17:
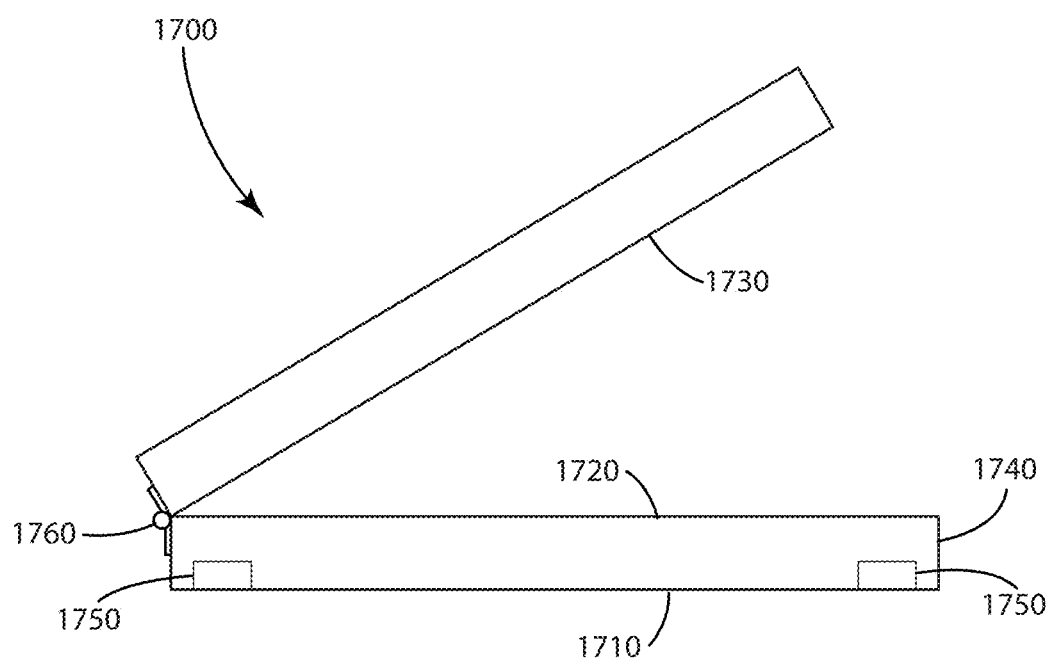
FIG. 17 shows a side view of a magnetic operator interface assembly according to one embodiment.

In FIG. 17, the magnetic operator interface assembly 1700 comprises a shield 1720 and a cover 1730. The shield 1720 comprises a base 1710 and a protrusion 1740. The shield 1720 is secured to a panel through a plurality of magnets 1750 as described above with respect to FIG. 10. The cover 1730 is movably connected to the shield 1720 through a sealed hinge 1760. In alternative embodiments, the cover 1730 may be movably connected to the shield 1720 through any other suitable means, such as a pivot. When the cover 1730 is closed, an operator interface is fully covered. Therefore, an operator interface is fully protected from outside forces, including, for example, UV rays and rain. Additionally, an operator interface is protected from the high pressure sprays used in wash-down procedures. The cover 1730 is rotated to an open position to allow an operator to have access to an operator interface. In the open position, the cover 1730 and the shield 1720 also prevent glare on the operator interface thus making the operator interface easier to use and further protecting the operator interface from damage.

Figure 14:
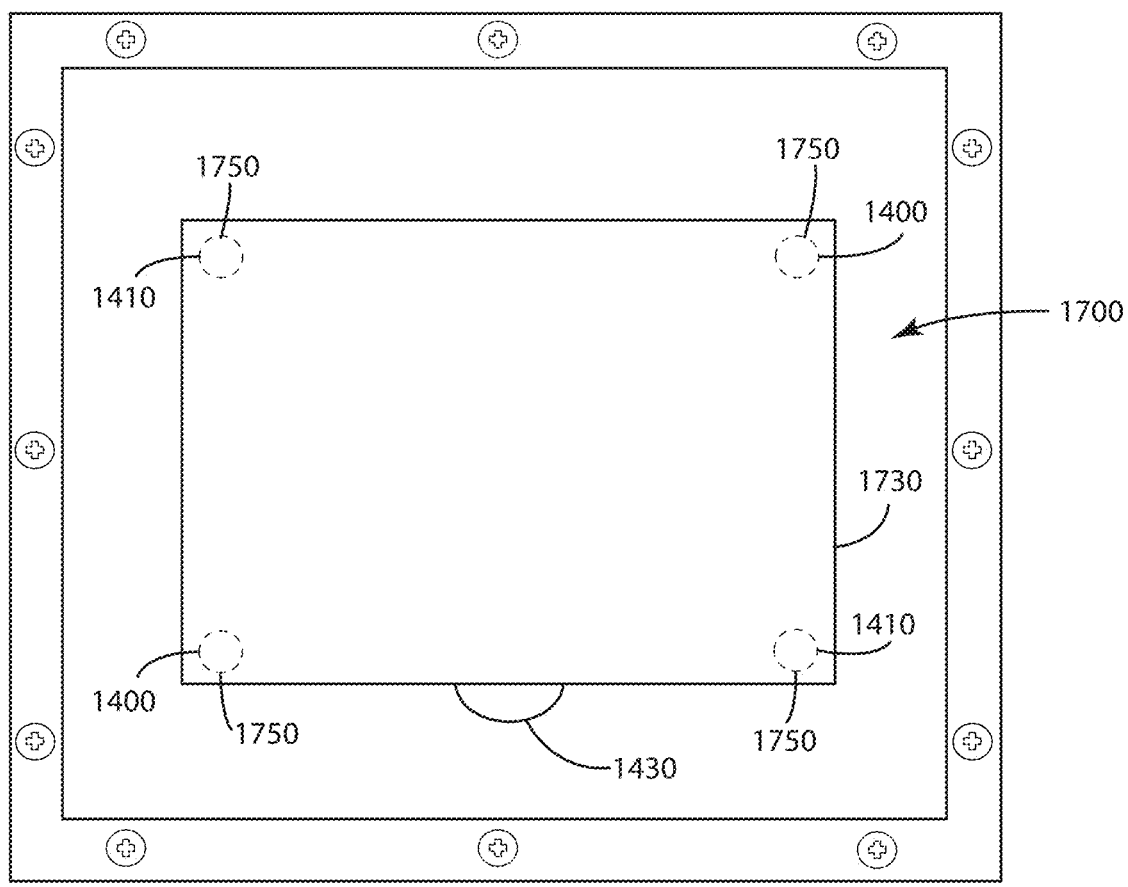
FIG. 14 is a front view of the magnetic operator interface assembly of FIG. 17 as attached to an enclosure made from non-magnetic material with specific magnet placement and programming.

FIG. 14 illustrates a front view of an alternative embodiment a magnetic operator interface assembly mounted to an enclosure using an alternative magnet configuration. The plurality of magnets 1750 include north pole magnets 1400 and south pole magnets 1410. In the depicted embodiment, the enclosure 1210 is made from a non-magnetic material and corresponding enclosure magnets (not shown) are included on the enclosure that pair with the assembly magnets 1400, 1410 to mount the assembly 1700. The cover 1730 is depicted in the closed position. The cover 1730 includes a handle 1430 that the cover 1730 to open, similar to as shown in FIG. 17. The handle 1430 is optionally included on the cover 1730 to allow for easier actuation. In this embodiment, the magnet configuration enables two mounting positions. Two north pole magnets 1400 are installed on the base 1710 diagonally across from each other. Two south pole magnets 1410 are installed on the base 1710 diagonally across from each other, and the two south pole magnets 1410 are installed in the corners of the base 1710 that are not occupied by the two north pole magnets 1400. The plurality of enclosure magnets 1240 are also installed in the rectangular shape of the plurality of magnets 1750 but with the opposite pole polarity of the respective north pole magnets 1400 and the respective south pole magnets 1410. This magnet configuration enables two mounting positions of the magnetic operator interface assembly 1700 because the magnetic pole configuration remains the same when the magnetic operator interface assembly 1700 is rotated 180°. Therefore, the north pole magnets 1400 and the south pole magnets 1410 will attract the enclosure magnets 1240 even if the magnetic operator interface assembly 1700 is installed upside down, and will provide sufficient magnetic force to allow the magnetic operator interface 1000 to attach to the panel 900. If the magnetic operator interface assembly 1700 is installed upside down, the cover 1730 opens downwards to form a perpendicular surface to the panel 900. The cover 1730 in this embodiment can have a number of uses, for example as a tray to hold tools of an operator while the operator accesses the operator interface 910.

Figure 15A:
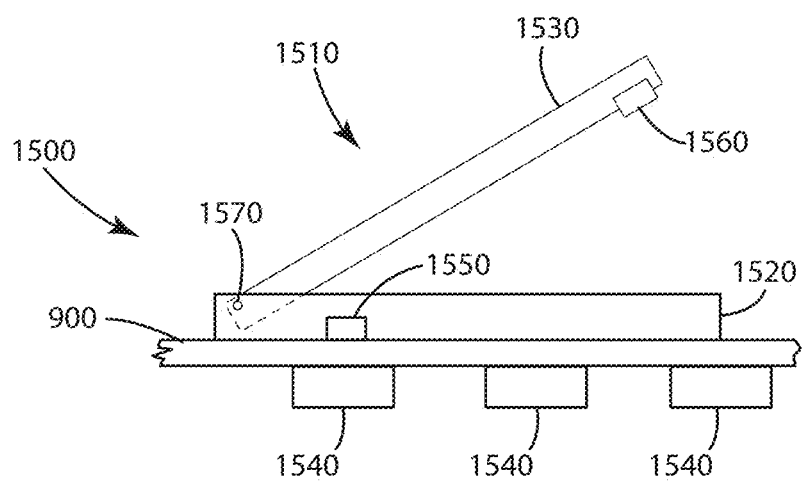
FIGS. 15a-b show a top view of a system for protecting an operator interface according to one embodiment.
Figure 15B:
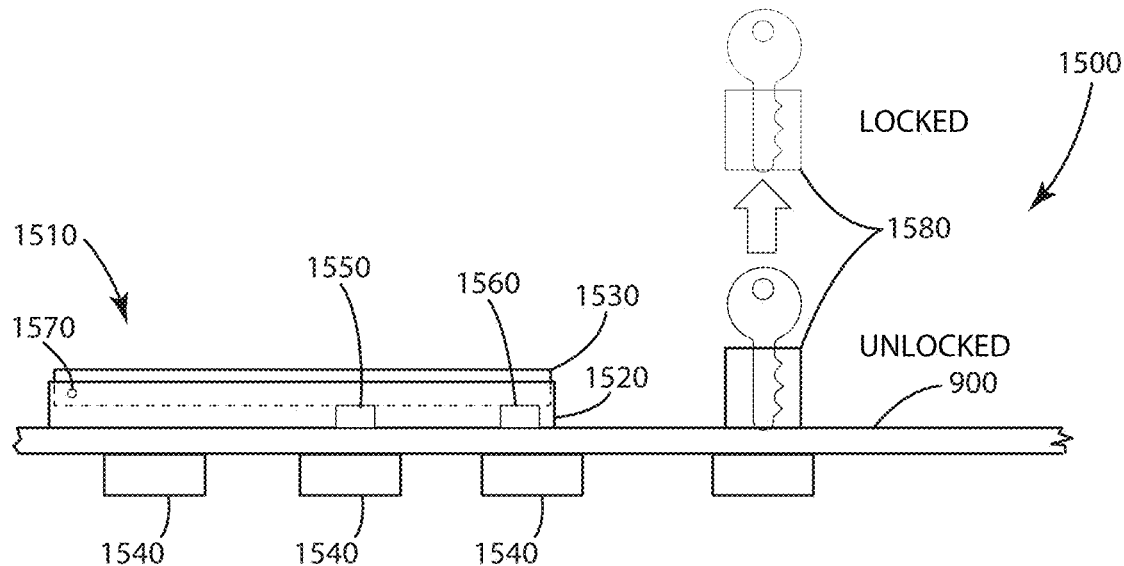

FIGS. 15A-B show partial top views of a system for protecting an operator interface 910 according to one embodiment, including an embodiment of a magnetic operator interface assembly 1510. The magnetic operator interface assembly 1510 includes a shield 1520, a cover 1530, a plurality of magnets 1550, and a cover magnet 1560. The cover 1530 is rotatably connected to the shield 1520 through a pivot 1570. The cover 1530 is in an open position in FIG. 15A and a closed position in FIG. 15B. The cover 1530 can be in a variety of other positions through its actuation to an open state, including, in some embodiments, being rotateable fully outward such that the cover 1530 contacts the panel 900. The cover 1530 can opens horizontally from left to right. In alternative embodiments, the system 1500 can be configured such that the cover 1530 opens horizontally right to left, vertically upward, or vertically downward. A plurality of sensors 1540 can be joined or otherwise installed along the inner surface of the panel 900 on the opposite side from where the magnetic operator interface assembly 1510 is magnetically mounted. For example, the plurality of sensors 1540 may be joined to the panel 900 through the use of a fastener such as an adhesive. The sensors 1540 may be magnetic field sensors, such as Reed sensors, Hall effect sensors, or another suitable sensor. Each sensor 1540 can detect a presence or change in the magnetic field to identify if the magnetic operator interface assembly 1510, or portion thereof, is present. The information sensed by the sensors 1540 can be provided as inputs to a controller located within the enclosure, which can be used for a plethora of functions, e.g., the sensors can provide feedback to the set of electronics 1220 to drive input and output logic to generate alarms, log data, or take other actions based on the sensor output. As will be described in more detail below, the sensors 1540 provide protection and sensing solutions for the enclosure.

The embodiments shown in FIGS. 15A-B show magnetic placement and sensing applications. The plurality of sensors 1540 can sense whether the magnetic operator interface assembly 1510 is attached to the panel 900 by sensing the magnetic field of the plurality of magnets 1550. The plurality of sensors 1540 may be electrically connected to the operator interface 910, either directly or through the set of electronics 1220. If the plurality of sensors 1540 do not detect the magnetic operator interface assembly 1510, the plurality of sensors 1540 may send a signal to the operator interface 910 or to a remote device and the operator interface 910 or remote device may display a message to an operator to let them know that the magnetic operator interface assembly 1000 is not installed.

The plurality of sensors 1540 may be configured to detect that the magnetic operator interface assembly 1510 is installed incorrectly. For example, if the magnetic operator interface assembly 1510 is misaligned, the plurality of sensors 1540 may detect a magnetic field from the plurality of magnets 1550 but the detected magnetic field is smaller than what the sensors 1540 would detect if the magnetic operator interface assembly 1510 was correctly aligned. The plurality of sensors 1540 may send a signal to the operator interface 910 and the operator interface may display a message to an operator to let them know that the magnetic operator interface assembly 1510 is misaligned. If the plurality of sensors 1540 detect that the magnetic operator interface assembly 1510 is properly aligned, the plurality of sensors 1540 may send a signal to the operator interface 910 and the operator interface 910 may display a message to an operator to let them know that the magnetic operator interface assembly 1510 is properly aligned.

The plurality of sensors 1540 may be configured to detect whether the cover 1530 is open or closed. When the cover 1530 is open, the plurality of sensors 1540 can detect an absence of magnetic field from the cover magnet 1560 and the plurality of sensors 1540 may send a signal to the operator interface 910 indicating the cover 1530 is open. When the cover 1530 is closed, the plurality of sensors 1540 will detect the presence of a magnetic field of the cover magnet 1560 and the plurality of sensors 1540 may send a signal to the operator interface 910. This allows an added layer of security because the system 1500 can know whether the operator interface 910 is protected (the cover 1530 is closed) or unprotected (the cover 1530 is open). More complex sensing like rotation and patterns can be enabled with programmable correlated magnetics as seen and described with reference to FIGS. 16*b-c*.

In all of the scenarios described above where the plurality of sensors 1540 sends a signal to the operator interface 910, the plurality of sensors 1540 and/or the operator interface 910 may be configured to communicate with a remote device and the remote device may display a message. In alternative embodiments, the signal from the plurality of sensors 1540 may be sent to a remote device to prevent or reschedule a wash down procedure or other potentially harsh event when the magnetic operator interface assembly 1510 is misaligned or absent, or when the cover 1030 is open.

The plurality of sensors 1540 may be disposed in a variety of different positions and the sensor 1540 in each position may have its own ID. For example, there may be an assembly sensor, an assembly cover sensor, an assembly position sensor, and an assembly lock sensor. The set of electronics 1220 may include a controller. The controller may be connected to the plurality of sensors 1540 and the controller may be configured to accept control signals that act as sensor inputs from the plurality of sensors 1540. In one embodiment, the controller has the following sensor inputs for the plurality of sensors 1540. For the assembly sensor, the controller can have sensor inputs that are indicative of the assembly being "In place" and "Removed". For the assembly cover sensor, the controller can have sensor inputs that are indicative of the cover being "Open" and "Closed". For the assembly position sensor, the controller can have sensor inputs that are indicative of the assembly being in "Position 1" and "Position 2". For the assembly lock sensor, the controller can have sensor inputs that correspond to the assembly being "Locked" and "Open". The sensor inputs may be digital or analog.

The cover magnet 1560 will now be described in more detail. The cover magnet 1560 may be installed on the inner surface of the cover 1530. One of the plurality of sensors 1540 can be installed on the non-interfacing side of the panel 900 to align with the cover magnet 1560 when the magnetic operator interface assembly 1510 is attached to the panel 900 and the cover 1530 is in the closed position. The corresponding sensor 1540 senses the presence of the cover magnet 1560 and can therefore send a signal to the controller or the operator interface 910 that the magnetic operator interface assembly 1510 is attached to the panel 900 and that the cover 1530 is closed. In one embodiment, the cover magnet 1560 is a south pole magnet. Alternatively, the cover magnet 1560 may be a north pole magnet or a multipole magnet. In order to allow for detection of the cover 1530 when the magnetic operator interface assembly 1510 is mounted rotated 180°, one of the plurality of sensors 1540 must be installed to align with the position of the cover magnet 1560 when the magnetic operator interface assembly is rotated 180°.

The magnetic field sensors 1540 and a control system enable a plethora of functionality. The control system may be part of the set of electronics 1220. In one embodiment, a sensor 1540, a key 1580, and a control system can work in combination to enable a locking system. Some of the sensors 1540 and the control system can enable detection of the presence of the cover 1530, the status of the cover 1530, and the position of the cover 1530. Additional functionality can be provided with the introduction of one or more programmable correlated magnets. As shown in FIG. 15b, the sensor 1540 can be used to determine whether a key 1580 is in place or if it is removed.

Figure 16C:
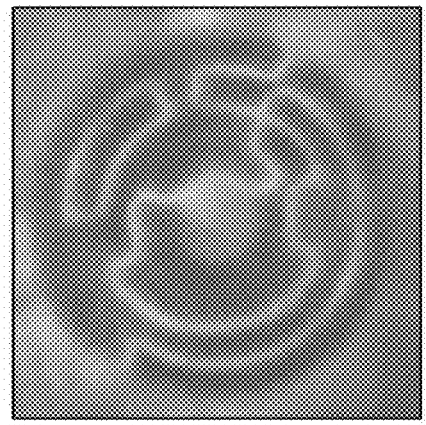
FIGS. 16a-c depict a variety of digital signatures of a key according to three embodiments.
Figure 16B:
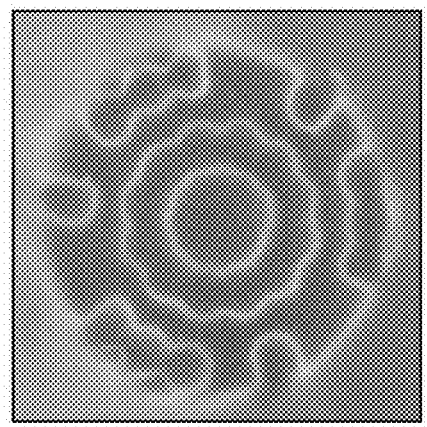
Figure 16A:
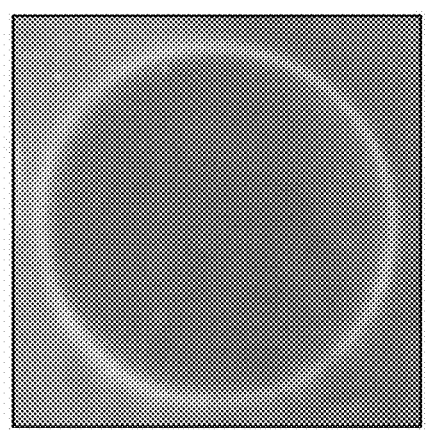

In some embodiments, the system 1500 for protecting an operator interface may include a lock in the form of a key 1580 to provide security for the operator interface 910. FIGS. 16A-C show a variety of magnetic signatures for different magnet configurations. The magnetic signature is the magnetic field produced by the key 1580. FIG. 16a depicts the magnetic signature of a standard magnet, FIG. 16b depicts the magnetic signature of a correlated magnet, and FIG. 16c depicts the magnetic signature of a correlated magnet for rotation. FIG. 16a shows the magnetic signature that would be received by the corresponding sensor 1540 if the key 1580 was a standard magnet. This provides an additional level of security over the system for protecting an operator interface 1510 which does not include a lock because the addition of a lock can be used to limit access to the operator interface 910. For example, the controller (e.g., electronics 1220 or a separate controller within the enclosure) can receive the sensor signals from the sensor 1540 corresponding to the key and activate the panel 910 in response to sensing presence of the key magnet 1580. Further, the sensor 1540 corresponding to the key can deactivate or restrict functionality of the panel 910 (or a portion thereof) in response to sensing absence of the key magnet 1580. Deactivation can include turning off the panel entirely or a portion thereof. Restriction of functionality can include switching the panel to a restricted function mode where less than all functionality of the panel is provided relative to the functionality provided when the magnet is present. Alternatively, restriction of functionality can include a restricted mode that provides display features without the ability to edit or make changes at the interface. The restricted modes may include a feature that allows for a security code or other software bypass that can be utilized in lieu of providing the key magnet 1580. In addition, or alternatively, during restricted mode, various emergency functionality may still be provided. In some embodiments, one or more alerts may be activated or logs collected and provided to a server over a network connection, such as an Internet connection. Activation of the interface without the magnet key 1580 can trigger a video, sound, keystroke, or other interface capture recording. The recording can be triggered stealthily without indication to the user or simultaneously with an alert to the user that their actions are being recorded.

The corresponding key sensor 1540 may also be configured to sense a particular or magnetic field pattern generated by the key magnet 1580. This provides an additional layer of security above and beyond presence of a magnetic signature of a standard magnet as in FIG. 16a. FIG. 16b depicts a specific profile or digital pattern for a hall effect device, whereas FIG. 16c shows a specific profile that produces a digital pattern when rotated for a hall effect device. The digital pattern may also be referred to as a digital signature or magnetic signature. Both FIGS. 16b and 16c can be produced with correlated magnets. A programmable correlated magnet provides a non-uniform, rare, potentially unique, signature when sensed by a magnetic field sensor. Because the correlated magnet is not symmetric, as the correlated magnet rotates, it continues to provide a unique magnetic field profile which may be used for unlocking functionality. A digital pattern can be generated by programming multiple north/south ("N/S") poles across the magnet rather than just one. Multiple fields within the magnet may also be programmed. The system for protecting an operator interface 1500 can provide a detent-like feature while locating the key 1580 or the magnetic operator interface assembly 1510.

In the scenario of FIG. 16b, once the plurality of sensors 1540 detect the key 1580, the plurality of sensors 1540 can determine whether the detected digital pattern is verified, and, if it is, the plurality of sensors 1540 can signal the controller to unlock the magnetic operator interface assembly 1510 to provide the key-holder access to the operator interface 910. Absence of the verified pattern can be utilized to restrict or prevent access, such as by any of the myriad of ways discussed above in connection with a standard magnet key embodiment. The corresponding key sensor 1540 can also be configured to determine whether the key 1580 has been rotated to match an expected orientation (or pattern of orientations). These pattern embodiments can provide increased security over a presence based system because an unauthorized user would have to not only have a magnet, but have a magnet (or other object) that not only provides the specific magnetic field pattern in order to gain access to the operator interface 910.

In the scenario of FIG. 16c, once the corresponding key sensor 1540 detects the key 1580, the key 1580 is rotated, and the key sensor 1540 can verify the digital pattern of the key 1580. The key sensor 1540 can responsively signal the controller to unlock the magnetic operator interface assembly 1510. The sensor 1540 can send the signal to unlock the magnetic operator interface assembly 1510 without being physically connected to the magnetic operator interface assembly 1510 and does not involve breaching or breaking the seal between the magnetic operator interface assembly 1510 and the panel 900. In addition to a magnetic profile or signature associated with the key 1580, a rotational profile can be created as shown in FIG. 16c. The rotational profile can have specific pulse and field patterns. This can provide an additional level of security because the digital signature of the key 1580 has additional complexity and thus is more difficult for an unauthorized user to duplicate to gain access to the operator interface 910.

A different pattern can be programmed for each independent user of the operator interface 910 such that each key 1580 corresponds to a specific user. Alternatively, keys 1580 can correspond to a specific group of users y providing users of each group with the same or a similar magnet key. The key corresponding sensor 1540 can learn the sensing profile for each user's key 1580, which may be preprogrammed into the system. This allows the system to provide different features or different levels of access depending on the user's profile.

In the embodiments discussed above, the magnet key 1580 and corresponding sensor 1540 can be utilized to provide security by changing functionality of the electronics 1220. In other embodiments, the magnet key 1580 and corresponding sensor 1540 can act as a trigger for an electronically actuable lock configurable between a locked state that prevents actuation of the cover 1530 from the closed position to the open position and an unlocked state that allows actuation of the cover 1530 from the closed position to the open position. The lock can be in communication with a processor that is configured to automatically open the lock in response to the locking sensor 1540 detecting the presence of a pre-defined magnetic signature, for example from the key 1580, and to automatically lock the lock in response to the locking sensor 1540 not detecting the presence of the pre-defined magnetic signature. In one embodiment, the lock can be configured to open the lock in response to multiple pre-defined magnetic signatures.

Additionally, or alternatively, the lock may include an electromagnet. When the electromagnet switches from an un-energized state to an energized state, the electromagnet may couple to the cover 1530 with sufficient magnetic force to prevent an operator from opening the cover 1530. When the electromagnet switches from an energized state to an un-energized state, the electromagnet magnetically decouples from the cover 1530 to allow an operator to open the cover 1530. In an alternative embodiment, the electromagnet may be actuable. The electromagnet may be actuable from a first position to a second position. In the first position, the electromagnet may magnetically decouple from the cover 1530 allowing an operator to open the cover 1530, and, in the second position, the electromagnet may magnetically couple to the cover 1530 with sufficient force to prevent an operator from opening the cover 1530.

In one embodiment, the lock may be used to lock the functionality of the operator interface instead of or in addition to limiting access to the operator interface. When the locking sensor 1540 detects the presence of an approved key 1580, the sensor 1540 can signal a controller to allow an operator to access the functionality of the operator interface. For example, if the operator interface is an HMI screen, the controller can allow the operator access to all or a subset of the functionalities displayed on the HMI screen. If the locking sensor 1540 detects an unapproved key 1580 or the absence of a key, the sensor 1540 can signal the controller to limit the functionality of the operator interface. For example, if the operator interface is a pushbutton, the controller can disable the pushbutton such that even if it is pushed it will not trigger the intended event. The controller can allow access to the full functionality of the operator interface, a subset of the functionality of the operator interface, or none of the functionality of the operator interface.

Directional terms, such as "vertical," "horizontal," "top," "bottom," "upper," "lower," "inner," "inwardly," "outer" and "outwardly," are used to assist in describing the invention based on the orientation of the embodiments shown in the illustrations. The use of directional terms should not be interpreted to limit the invention to any specific orientation(s).

The above description is that of current embodiments of the invention. Various alterations and changes can be made without departing from the spirit and broader aspects of the invention as defined in the appended claims, which are to be interpreted in accordance with the principles of patent law including the doctrine of equivalents. This disclosure is presented for illustrative purposes and should not be interpreted as an exhaustive description of all embodiments of the invention or to limit the scope of the claims to the specific elements illustrated or described in connection with these embodiments. For example, and without limitation, any individual element(s) of the described invention may be replaced by alternative elements that provide substantially similar functionality or otherwise provide adequate operation. This includes, for example, presently known alternative elements, such as those that might be currently known to one skilled in the art, and alternative elements that may be developed in the future, such as those that one skilled in the art might, upon development, recognize as an alternative. Further, the disclosed embodiments include a plurality of features that are described in concert and that might cooperatively provide a collection of benefits. The present invention is not limited to only those embodiments that include all of these features or that provide all of the stated benefits, except to the extent otherwise expressly set forth in the issued claims. Any reference to claim elements in the singular, for example, using the articles "a," "an," "the" or "said," is not to be construed as limiting the element to the singular.

The embodiments of the invention in which an exclusive property or privilege is claimed are defined as follows:

1. A magnetic operator interface assembly for magnetically mounting to a sealed enclosure to protect an operator interface extending from the sealed enclosure, the magnetic operator interface assembly comprising:
    a backing having a magnet mount surface and a shield mount surface, the backing defining an interface opening;
    a plurality of magnets joined to the magnet mount surface of the backing, the plurality of magnets configured to provide magnetic characteristics sufficient to removably magnetically couple the magnetic operator interface assembly to a sealed enclosure and withstand operational forces;
    a shield joined to the shield mount surface of the backing, wherein the shield extends away from the shield mount surface of the backing; and
    a cover movably connected to at least one of the backing and the shield, wherein the cover is movable between a closed cover position that covers the interface opening and an open cover position that exposes the interface opening.

2. The magnetic operator interface assembly of claim 1 wherein the shield includes a barrier that extends away from the shield mount surface of the backing, wherein the barrier is configured to reduce at least one of severity and number of environmental conditions on an operator interface extending from a sealed enclosure through the interface opening when the magnetic operator interface assembly is installed.

3. The magnetic operator interface assembly of claim 1 wherein the plurality of magnets are permanent bar magnets configured with magnetization and pole orientations to provide a combined magnetic strength sufficient to withstand operational forces.

4. The magnetic operator interface assembly of claim 1 wherein the plurality of magnets are pot magnets, wherein the sealed enclosure includes a ferromagnetic surface, and wherein each of the plurality of pot magnets is disposed about the magnet mount surface to generate an isolated individual closed circuit with a different portion of the ferromagnetic surface of a sealed enclosure, and wherein the plurality of pot magnets are configured with a first magnetic pole at the center region of the pot magnet and a second, opposite, magnetic pole at the edge of the pot magnet.

5. The magnetic operator interface assembly of claim 1 wherein the magnet mount surface forms a channel having a channel wall having a depth, wherein the plurality of magnets joined to the magnet mount surface are arranged in the channel such that the plurality of magnets form a flush mounting surface at the depth of the channel wall, wherein the plurality of magnets are configured to provide a magnetic attraction force sufficient to both magnetically mount to and seal the magnetic operator interface assembly against a surface of a sealed enclosure.

6. The magnetic operator interface assembly of claim 1 wherein the backing forms a magnetic field concentrating channel, each of the plurality of magnets having an exposed magnetic face, wherein the magnetic field concentrating channel locally concentrates the magnetic field generated at the exposed magnetic face of each of the plurality of magnets.

7. The magnetic operator interface assembly of claim 1 wherein the magnetic mount surface is configured to removably magnetically couple the magnetic operator interface assembly to a sealed enclosure including at least one of a panel having a magnetic portion, a plurality of enclosure magnets, and a magnetic enclosure surface.

8. The magnetic operator interface assembly of claim 1 wherein the plurality of magnets are configured to provide a magnetic strength within a magnetic strength range, the magnetic strength range being sufficient to withstand operational forces without preventing intentional manipulation of the magnetic operator interface assembly relative to a sealed enclosure.

9. The magnetic operator interface assembly of claim 1 including an open cover position magnet that magnetically couples the cover and the shield in response to the cover being moved in proximity to the open cover position, wherein strength of the open cover position magnet is configured based on a threshold amount of desired operator force to separate the cover and the shield.

10. The magnetic operator interface assembly of claim 1 wherein the shield includes the open cover position magnet, the cover includes a magnetic portion, and the magnetic portion of the cover magnetically couples to the open cover position magnet in the open position.

11. The magnetic operator interface assembly of claim 1 including a closed cover position magnet that magnetically couples the cover and the backing in response to the cover being moved in proximity to the closed cover position, wherein strength of the closed cover position magnet is configured based on a threshold amount of desired operator force to separate the cover and the backing.

12. The magnetic operator interface assembly of claim 11 wherein the backing includes the closed cover position magnet, the cover includes a lip having a magnetic portion, and the cover lip magnetically couples to the closed cover position magnet in the closed position.

13. The magnetic operator interface assembly of claim 1 further comprising a processor in communication with a key sensor joined to an interior surface of the sealed enclosure, wherein the key sensor is configured to sense a removable key magnet joinable to the exterior surface of the sealed enclosure, and wherein the key sensor communicate sensor inputs to the processor in response to the removable key magnet and the processor is configured to control the operator interface.

14. A magnetic operator interface assembly for mounting to a surface of a sealed enclosure, the magnetic operator interface assembly comprising:
  a backing configured to frame an operator interface;
  a plurality of magnets joined to the backing, the plurality of magnets sufficient to removably magnetically couple the magnetic operator interface assembly to a panel containing an operator interface; and
  a shield joined to the backing and extending away from the surface of the backing, wherein the shield extends at least partially around the periphery of the backing to protect an operator interface from an environment condition.

15. The magnetic operator interface assembly of claim 14 wherein the backing and the shield are formed as one piece.

16. The magnetic operator interface assembly of claim 14 further comprising a cover rotatably connected to at least one of the shield and the backing, the cover rotatable between a closed position blocking access to an operator interface and an open position enabling access to an operator interface.

17. The magnetic operator interface assembly of claim 16 further comprising at least one open state magnet joined to the shield, the at least one open state magnet allowing the cover to be fixed in an open position parallel to the inner surface of a portion of the shield through magnetic force of the at least one open state magnet.

18. The magnetic operator interface assembly of claim 16 further comprising an opening in the shield, wherein the opening is sized to fit a shackle of a lock, wherein the lock secures the cover in the closed position where the open shackle is inserted through the opening, closed, and the lock presents the cover's movement from the closed to open position.

19. The magnetic operator interface assembly of claim 16 further comprising at least one closed state magnet joined to the bottom edge of the shield, the at least one closed state magnet allowing the cover to be fixed in a closed position parallel to the outer surface of the backing through magnetic force of the at least one closed state magnet.

20. The magnetic operator interface assembly of claim 14 further comprising at least one notch in the backing defining an opening, the notch allowing liquid trapped between the backing and an enclosure to escape.

21. The magnetic operator interface assembly of claim 14 wherein the backing includes a body having a backing surface for engaging a sealed enclosure surface, wherein the plurality of magnets have a magnetic face flush with the backing surface, and wherein the backing is configured to frame the operator interface by at least partially outlining a two-dimensional area having a sufficient size and shape to receive one of a plurality of different operator interfaces.

22. The magnetic operator interface assembly of claim 14 further comprising a cover movably connected to at least one of the backing and the shield, wherein the cover includes a body with a first side flange and a second side flange that extend parallel to each other away from the cover body, wherein the first and second side flanges are rotatably connected to the shield.

23. The magnetic operator interface assembly of claim 14 further comprising a processor in communication with a key sensor joined to an interior surface of the sealed enclosure, wherein the key sensor is configured to sense a removable key magnet joinable to the exterior surface of the sealed enclosure, and wherein the key sensor communicate sensor inputs to the processor in response to the removable key magnet.

* * * * *